United States Patent
Kuniya et al.

(10) Patent No.: US 8,546,196 B2
(45) Date of Patent: Oct. 1, 2013

(54) NON-VOLATILE MEMORY DEVICE AND MANUFACTURING METHOD THEREOF

(75) Inventors: Takuji Kuniya, Mie (JP); Kotaro Noda, Mie (JP)

(73) Assignee: Kabushiki Kaisha Toshiba, Tokyo (JP)

(*) Notice: Subject to any disclaimer, the term of this patent is extended or adjusted under 35 U.S.C. 154(b) by 361 days.

(21) Appl. No.: 13/018,722

(22) Filed: Feb. 1, 2011

(65) Prior Publication Data

US 2011/0227019 A1 Sep. 22, 2011

(30) Foreign Application Priority Data

Mar. 18, 2010 (JP) ................................. 2010-063186

(51) Int. Cl.
*H01L 21/768* (2006.01)
*G11C 11/21* (2006.01)

(52) U.S. Cl.
USPC ................... 438/129; 365/148; 257/E21.582

(58) Field of Classification Search
USPC ................. 438/129; 365/148; 257/E21.582
See application file for complete search history.

(56) References Cited

U.S. PATENT DOCUMENTS

| 7,332,377 B2 | 2/2008 | Happ et al. | |
|---|---|---|---|
| 2002/0064069 A1 | 5/2002 | Goebel et al. | |
| 2006/0145134 A1* | 7/2006 | Hart et al. | 257/3 |
| 2006/0246606 A1* | 11/2006 | Hsu et al. | 438/3 |
| 2009/0134431 A1 | 5/2009 | Tabata et al. | |
| 2009/0137112 A1* | 5/2009 | Tabata et al. | 438/631 |
| 2009/0267047 A1 | 10/2009 | Sasago et al. | |
| 2009/0283739 A1 | 11/2009 | Kiyotoshi | |

FOREIGN PATENT DOCUMENTS

| JP | 4-275435 | 10/1992 |
|---|---|---|
| JP | 5-102470 | 4/1993 |
| JP | 6-163576 | 6/1994 |
| JP | 6-347826 | 12/1994 |
| JP | 2001-36024 | 2/2001 |
| JP | 2002-540594 A | 11/2002 |
| JP | 2003-78049 | 3/2003 |
| JP | 2009-130138 | 6/2009 |
| JP | 2009-267219 A | 11/2009 |

OTHER PUBLICATIONS

Office Action issued Aug. 14, 2012 in Japanese Patent Application No. 2010-063186 with English language translation.
Korean Office Action issued Jun. 19, 2012 in Patent Application No. 10-2011-23885 with English Translation.

* cited by examiner

*Primary Examiner* — Evan Pert
(74) *Attorney, Agent, or Firm* — Oblon, Spivak, McClelland, Maier, & Neustadt, L.L.P.

(57) ABSTRACT

According to one embodiment, a non-volatile memory device is formed as described below. First, a wiring material layer, which configures a part of a wiring of an element, is stacked above an element layer, the wiring material layer is processed in a predetermined shape, and the element layer is etched using the wiring material layer as a mask. Next, an insulation layer is embedded between etched patterns, and the insulation layer is removed using the wiring material layer as a stopper. Then, a wiring layer, which is in contact with the wiring material layer, is formed on the insulation layer from which the wiring material layer is exposed.

13 Claims, 24 Drawing Sheets

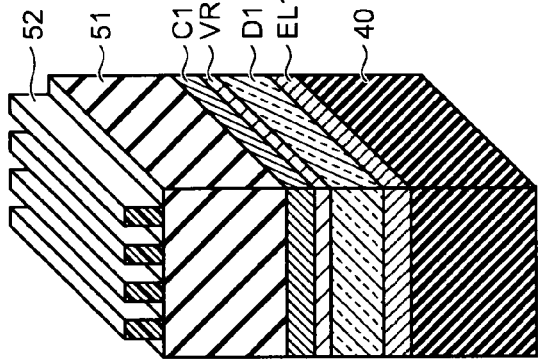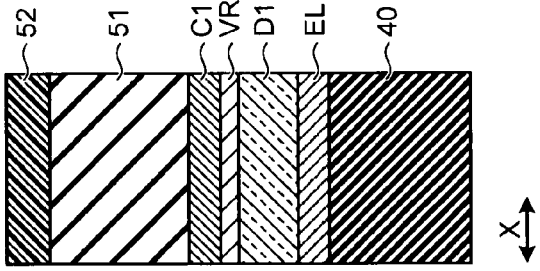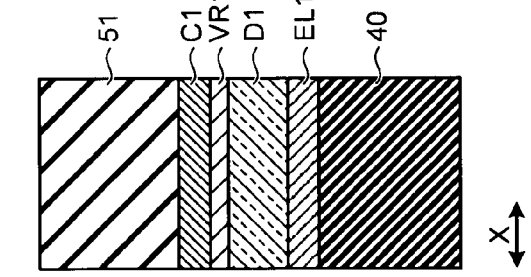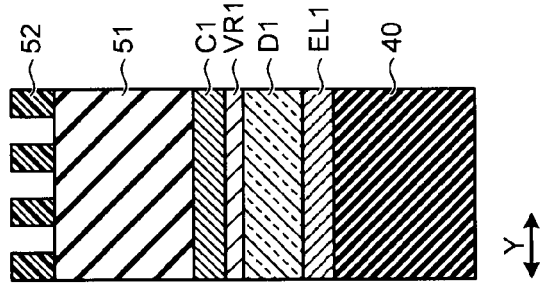

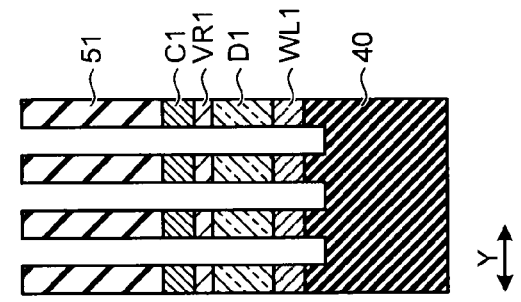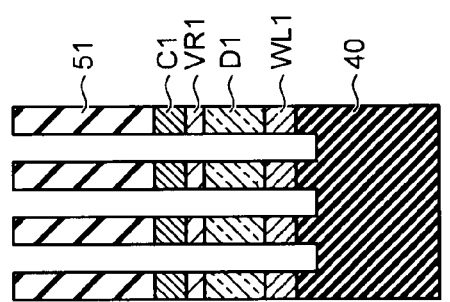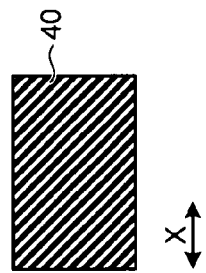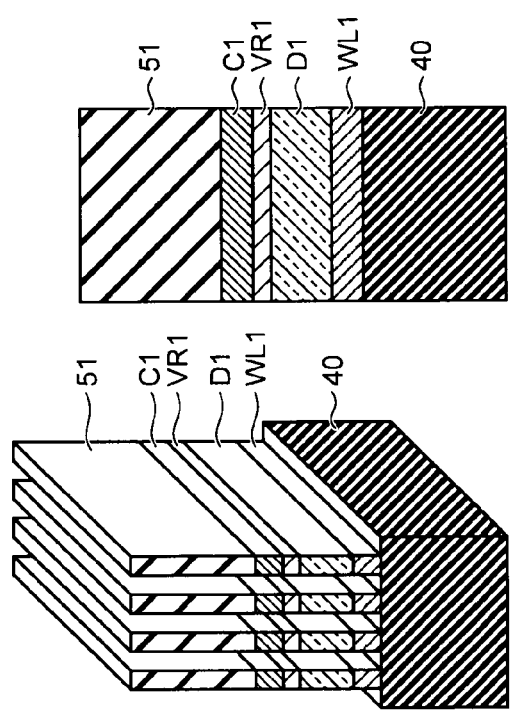

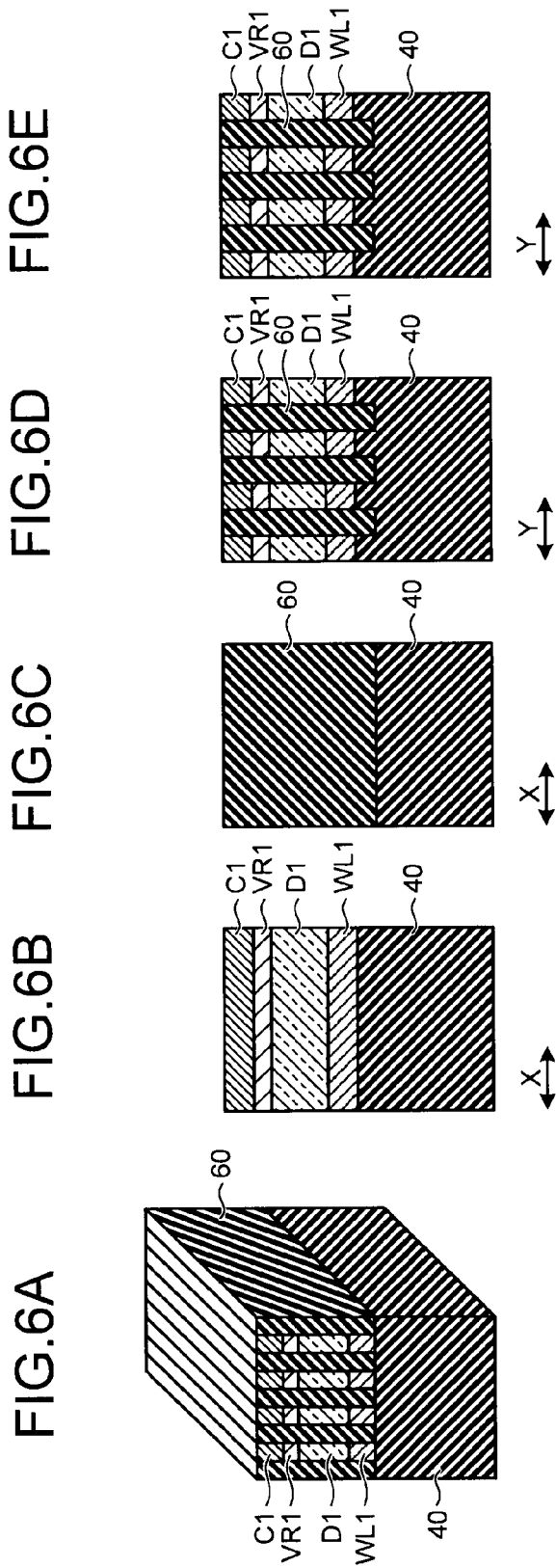

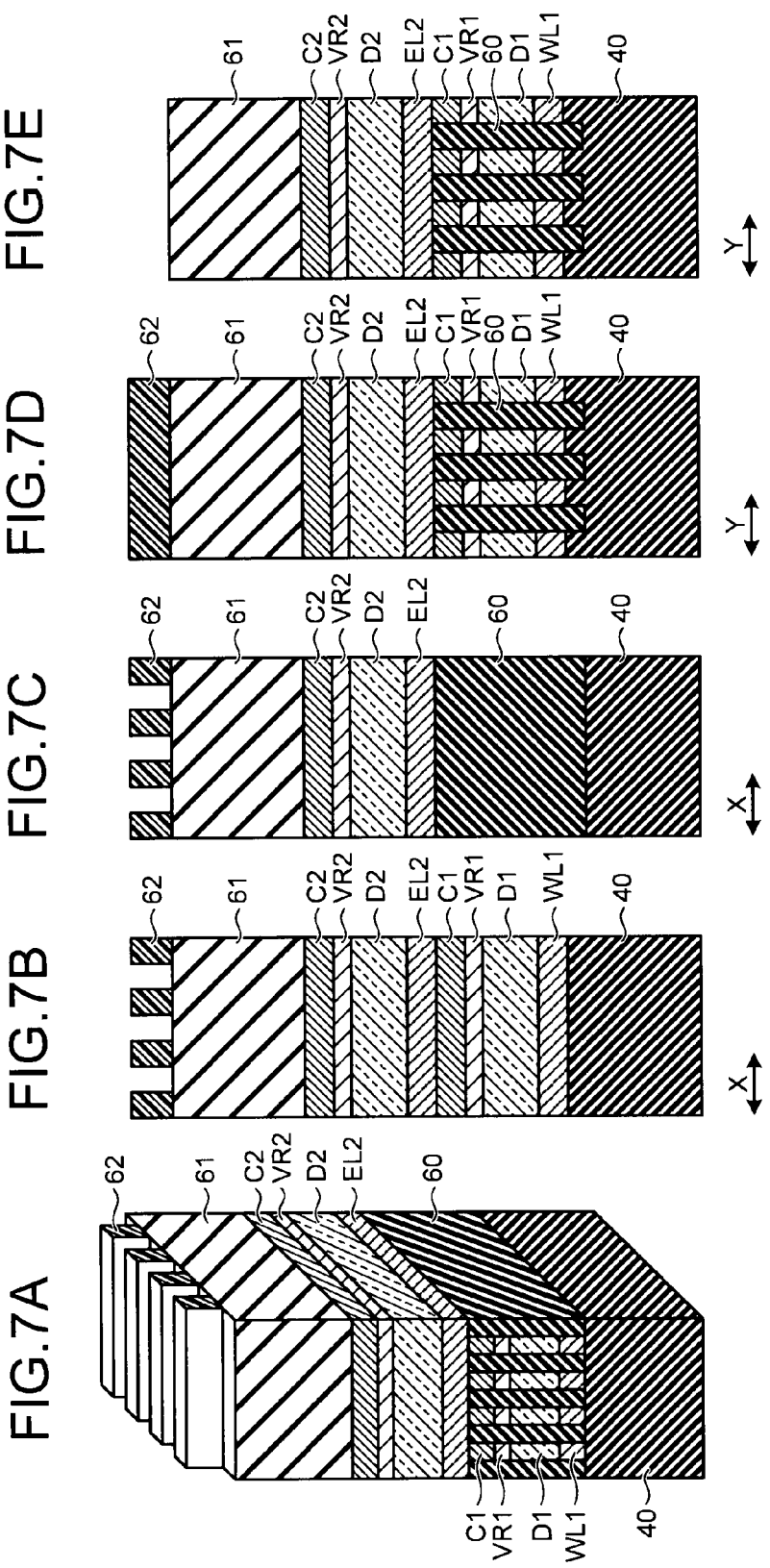

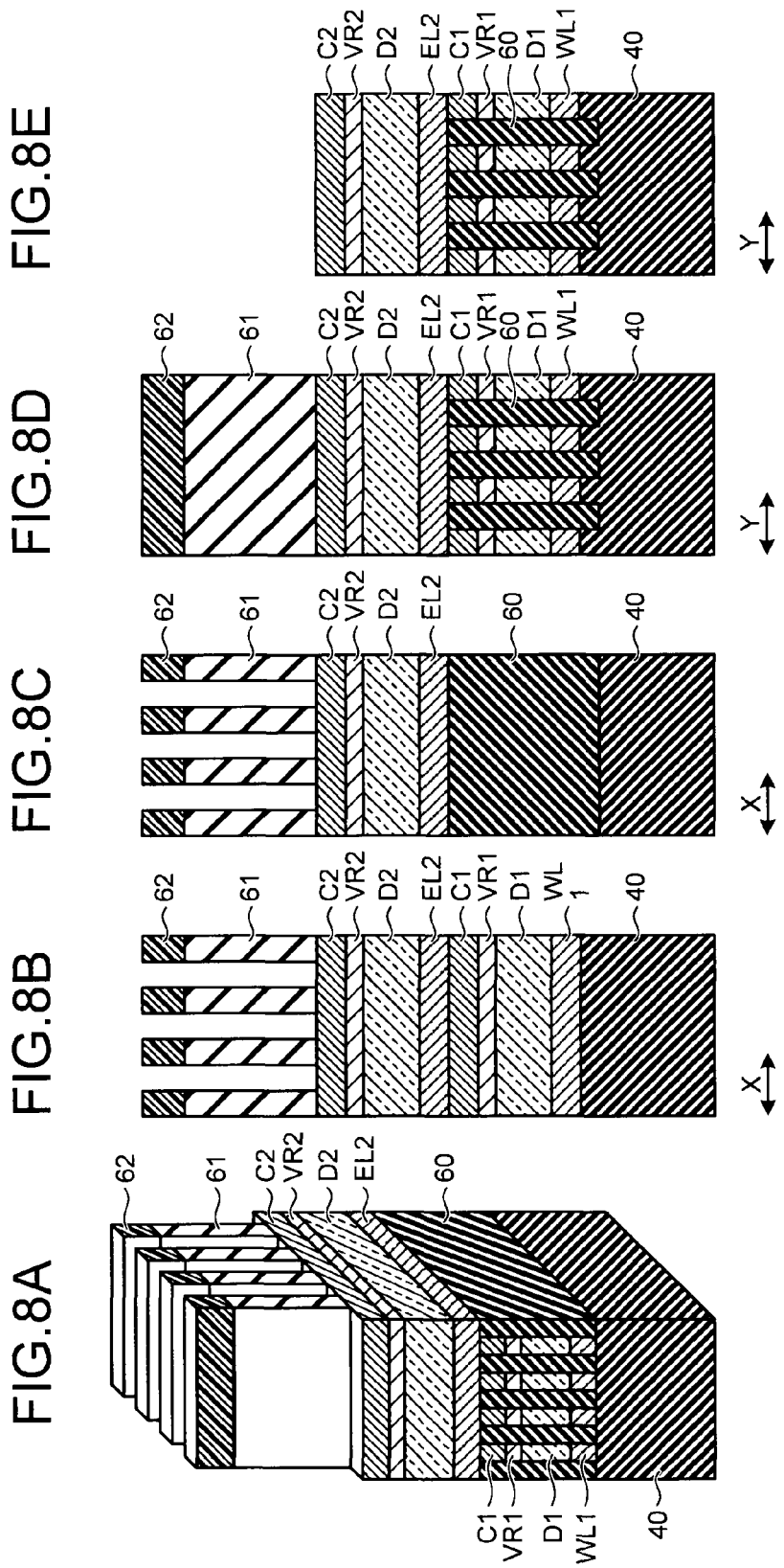

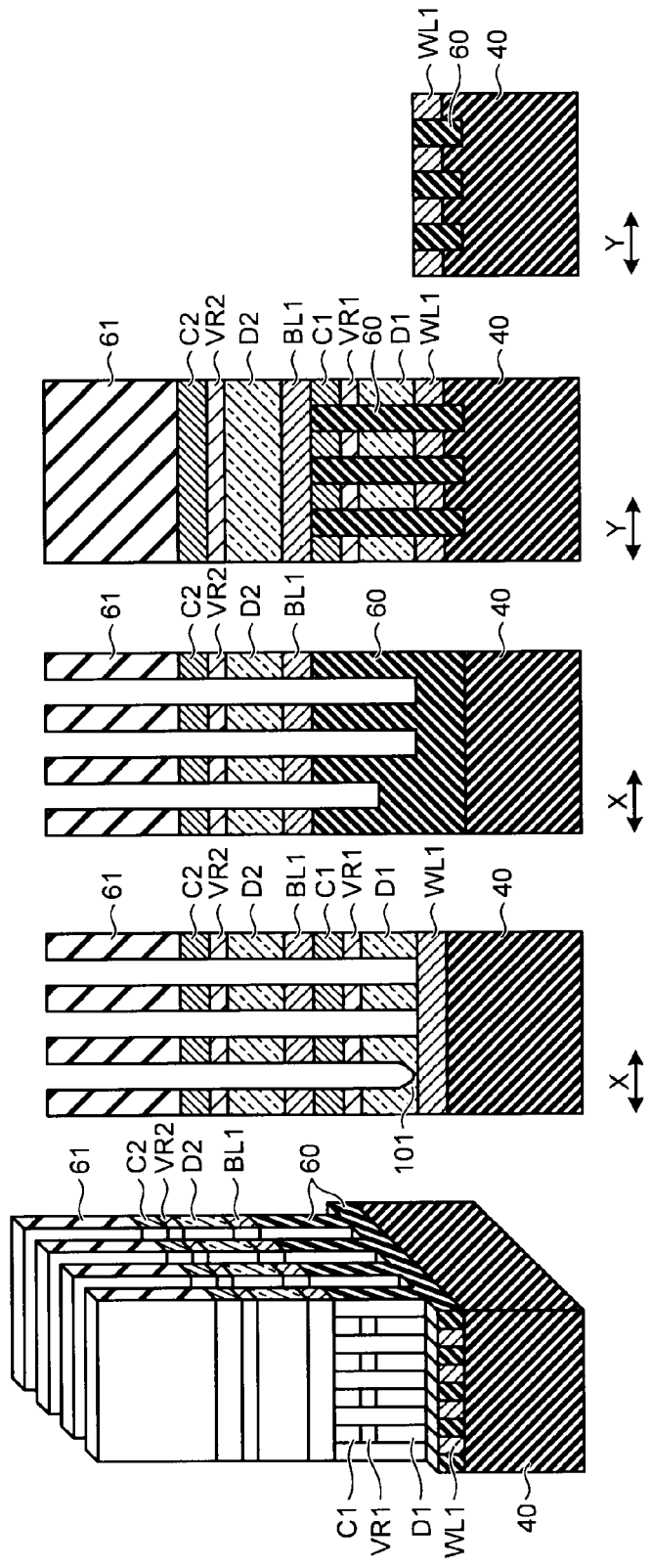

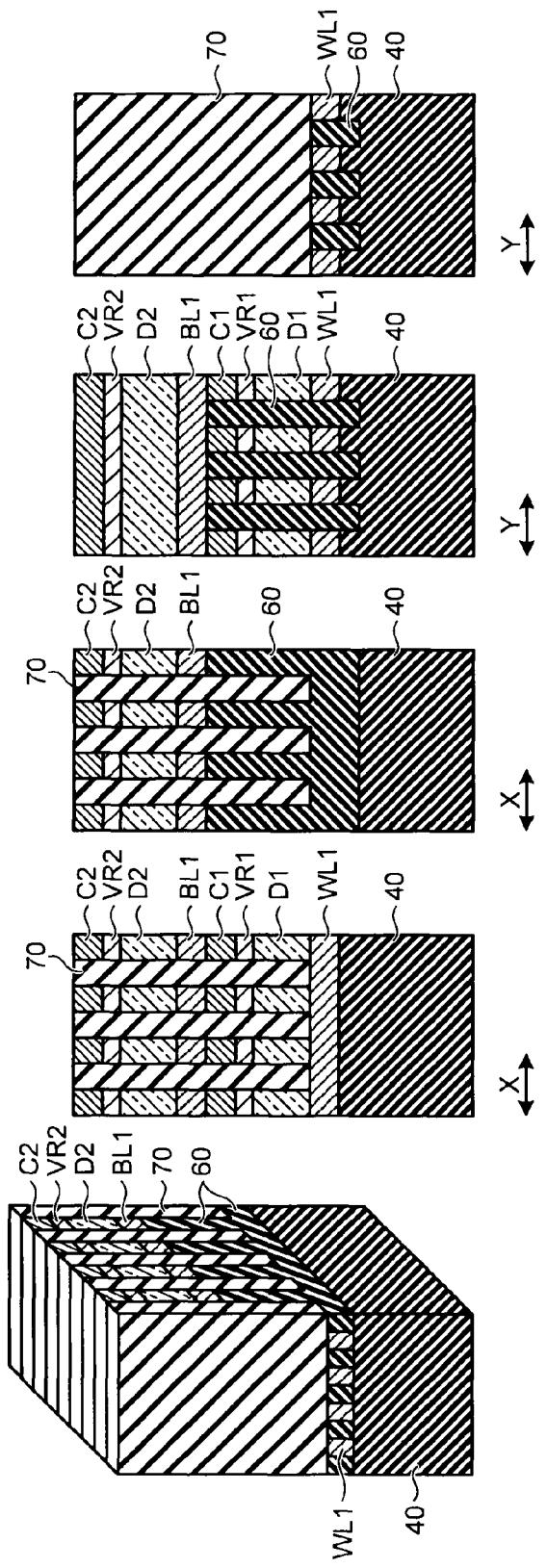

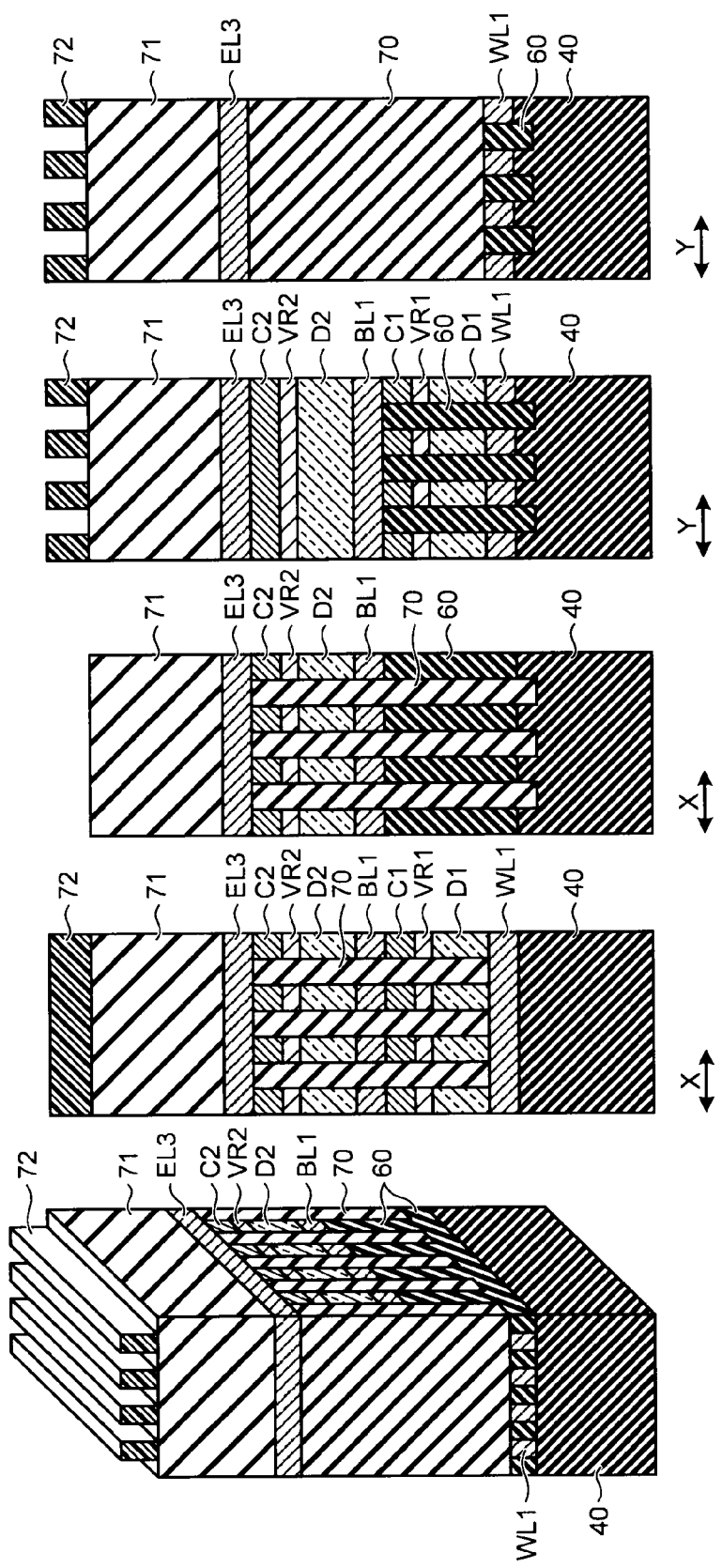

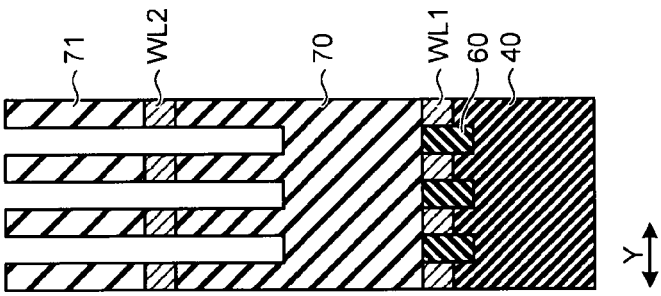
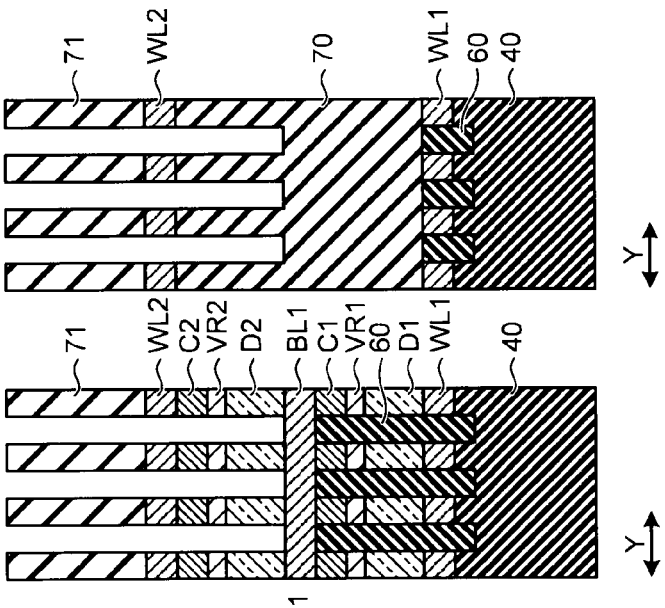
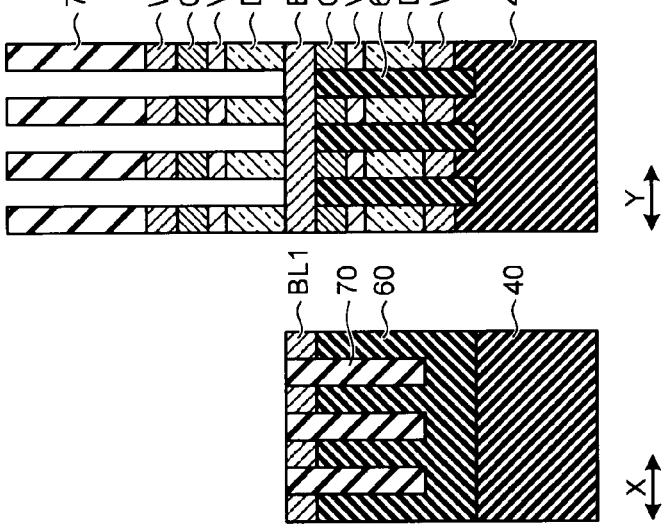
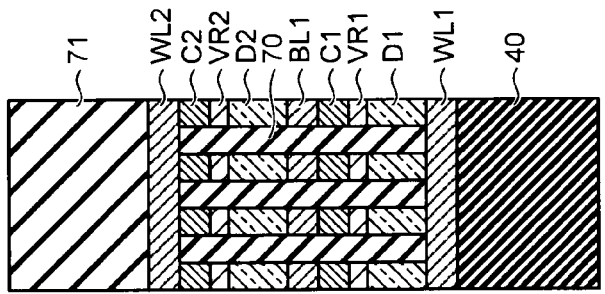
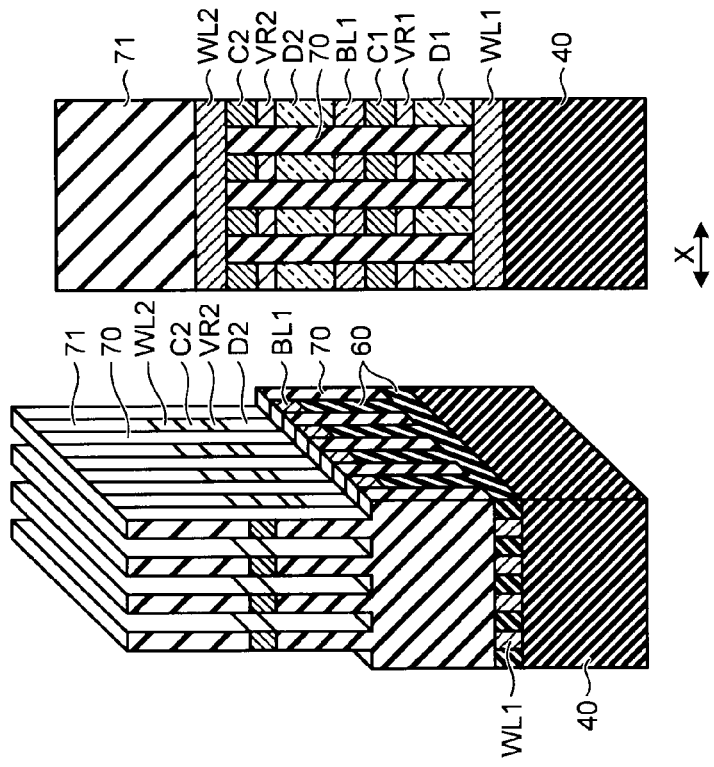

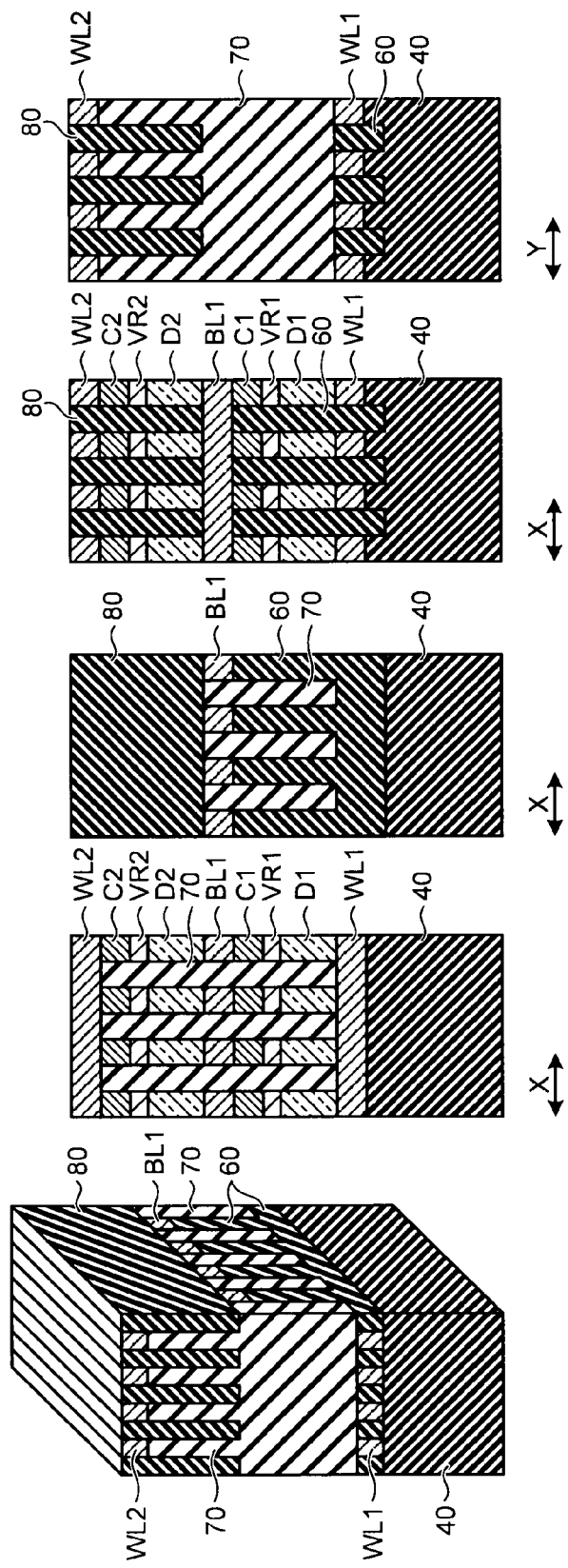

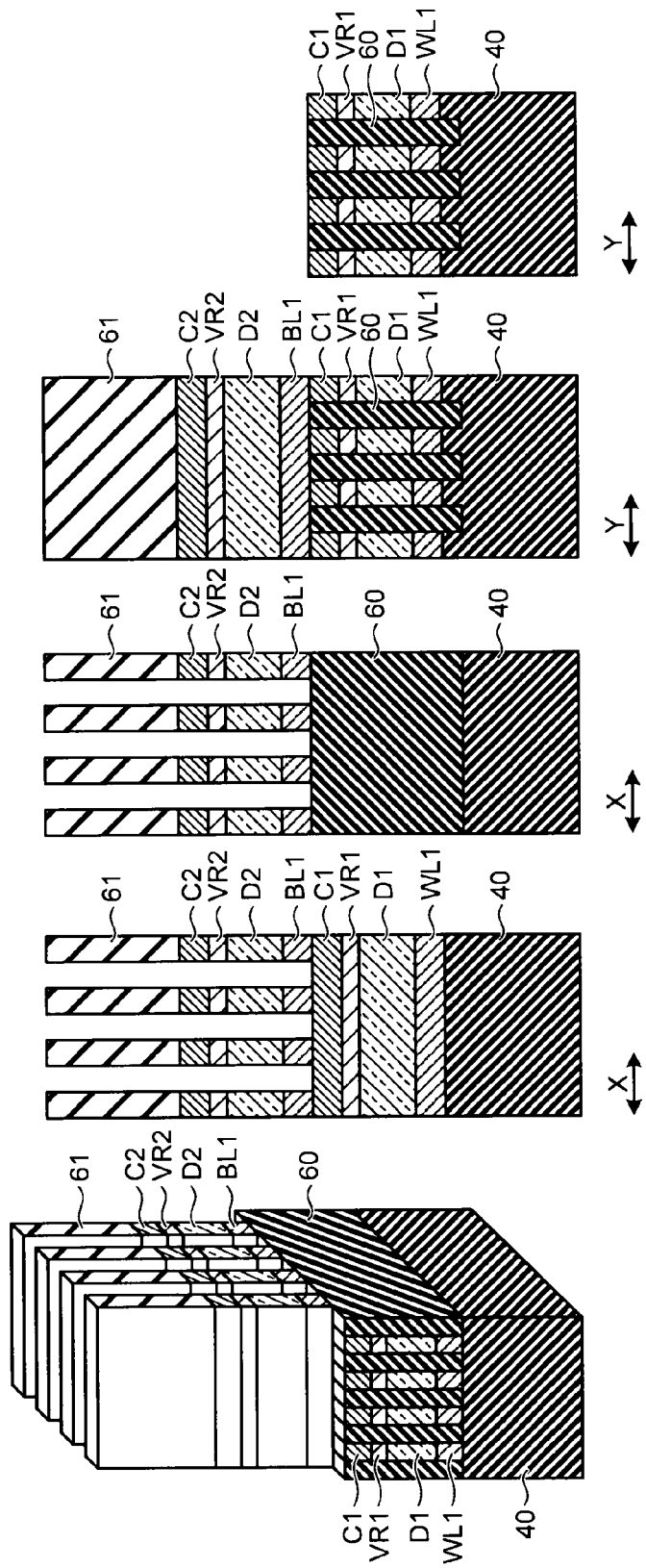

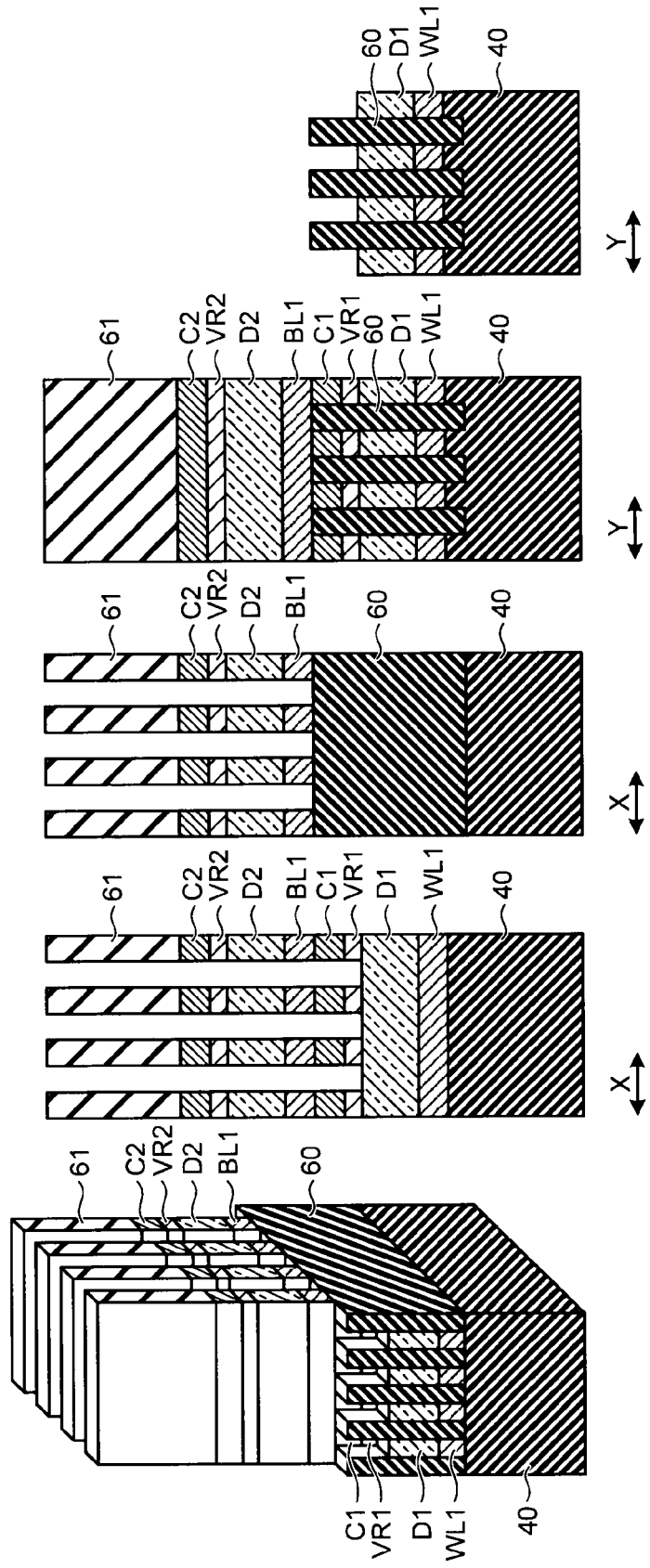

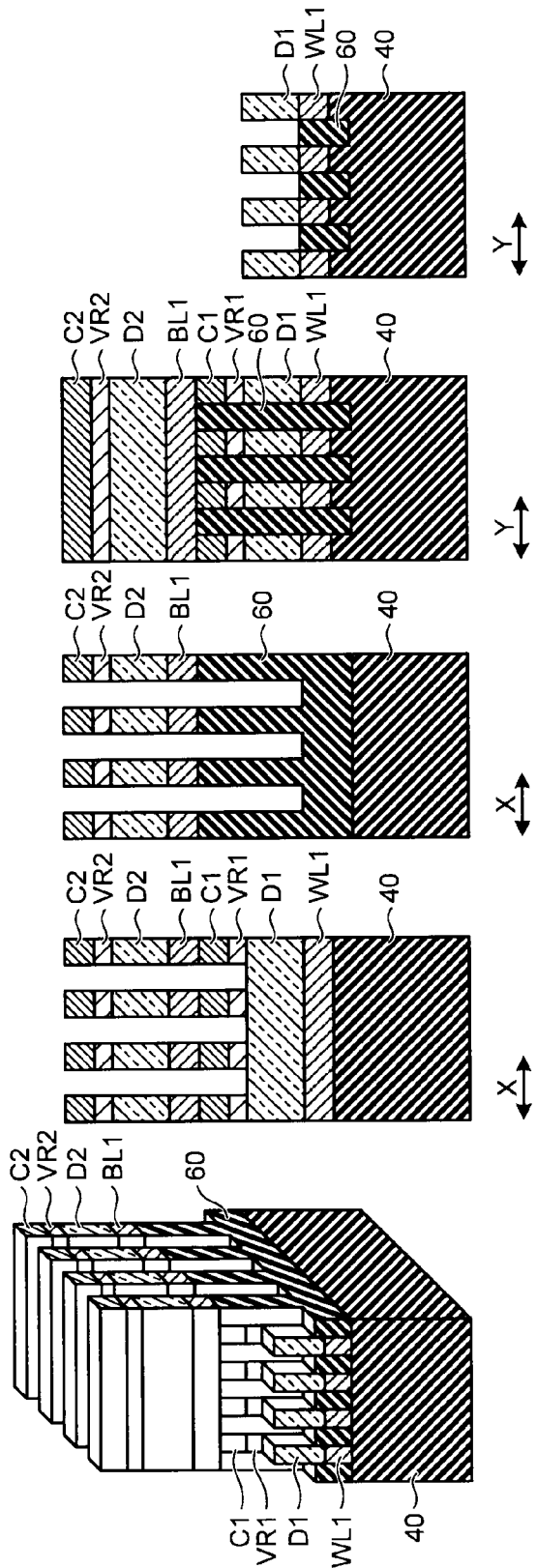

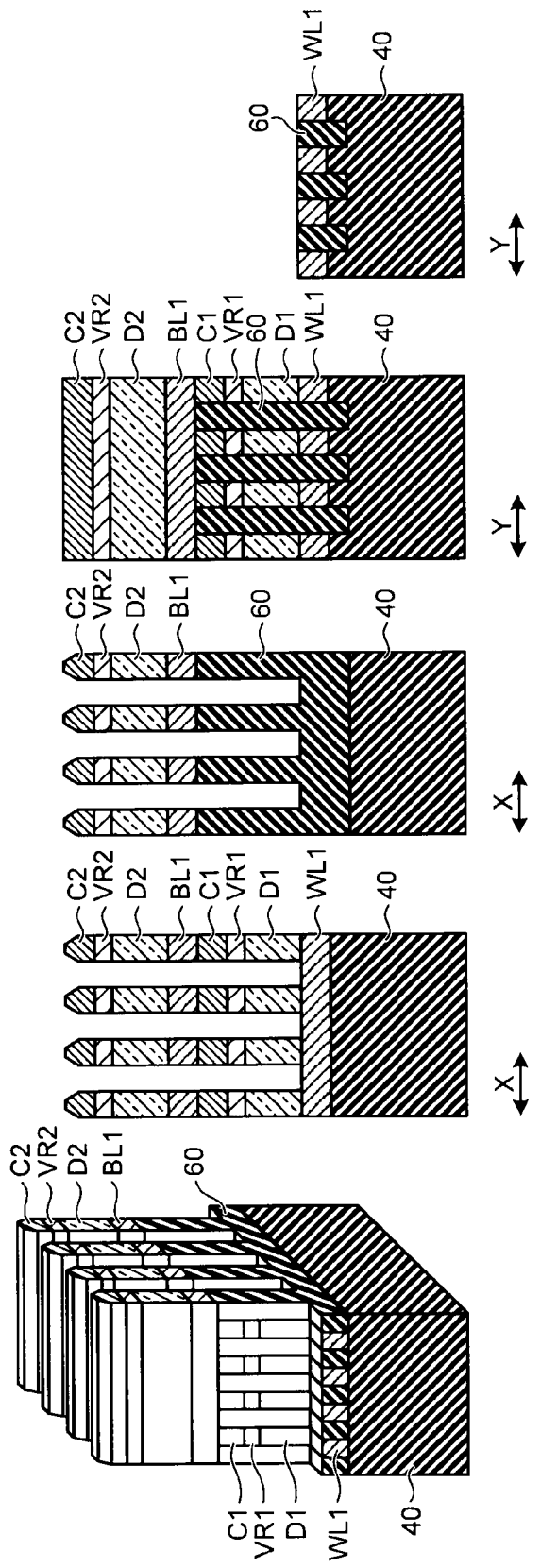

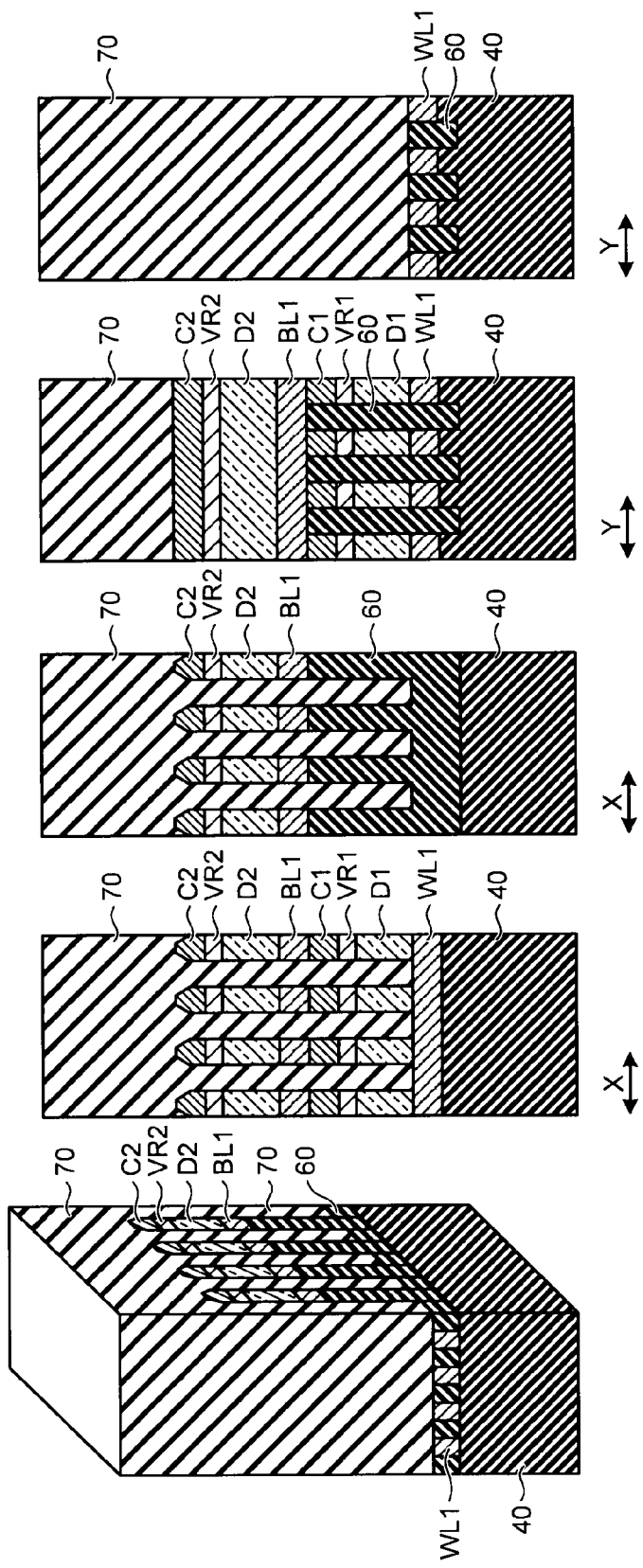

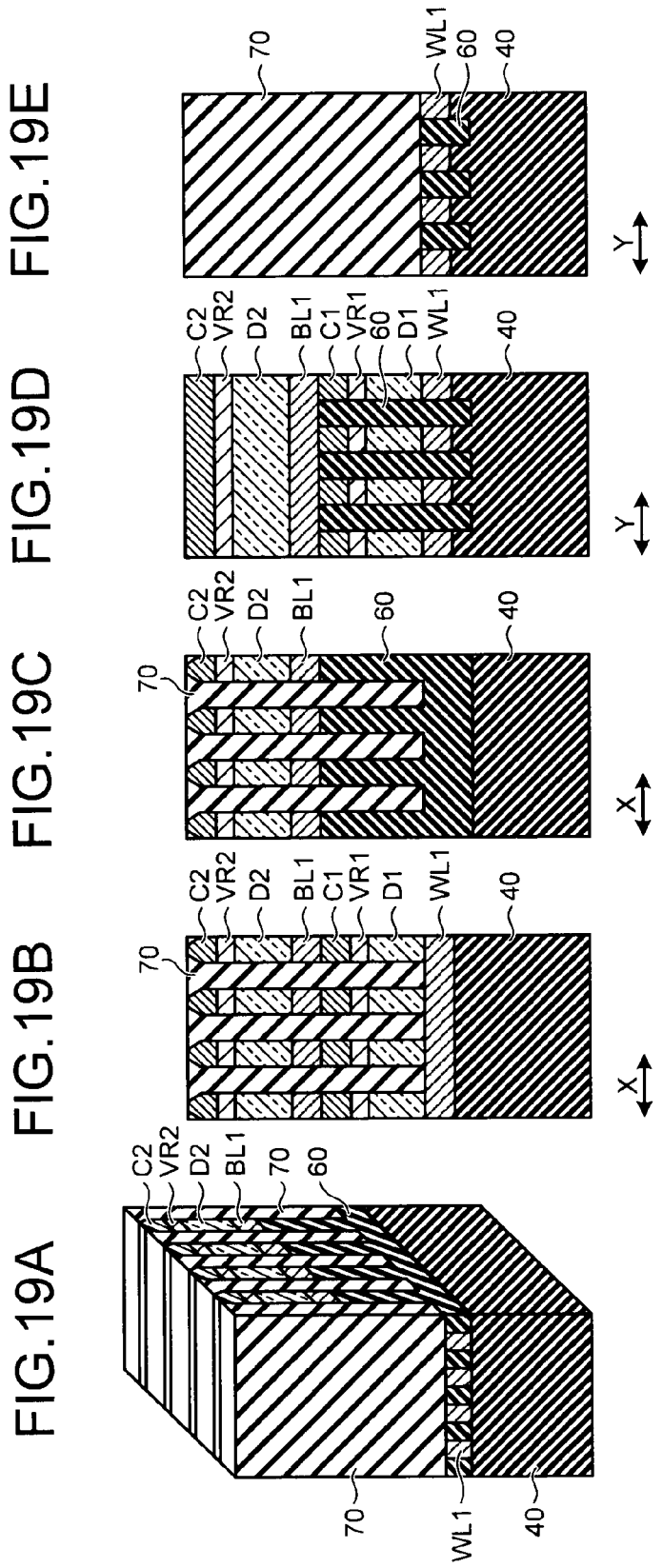

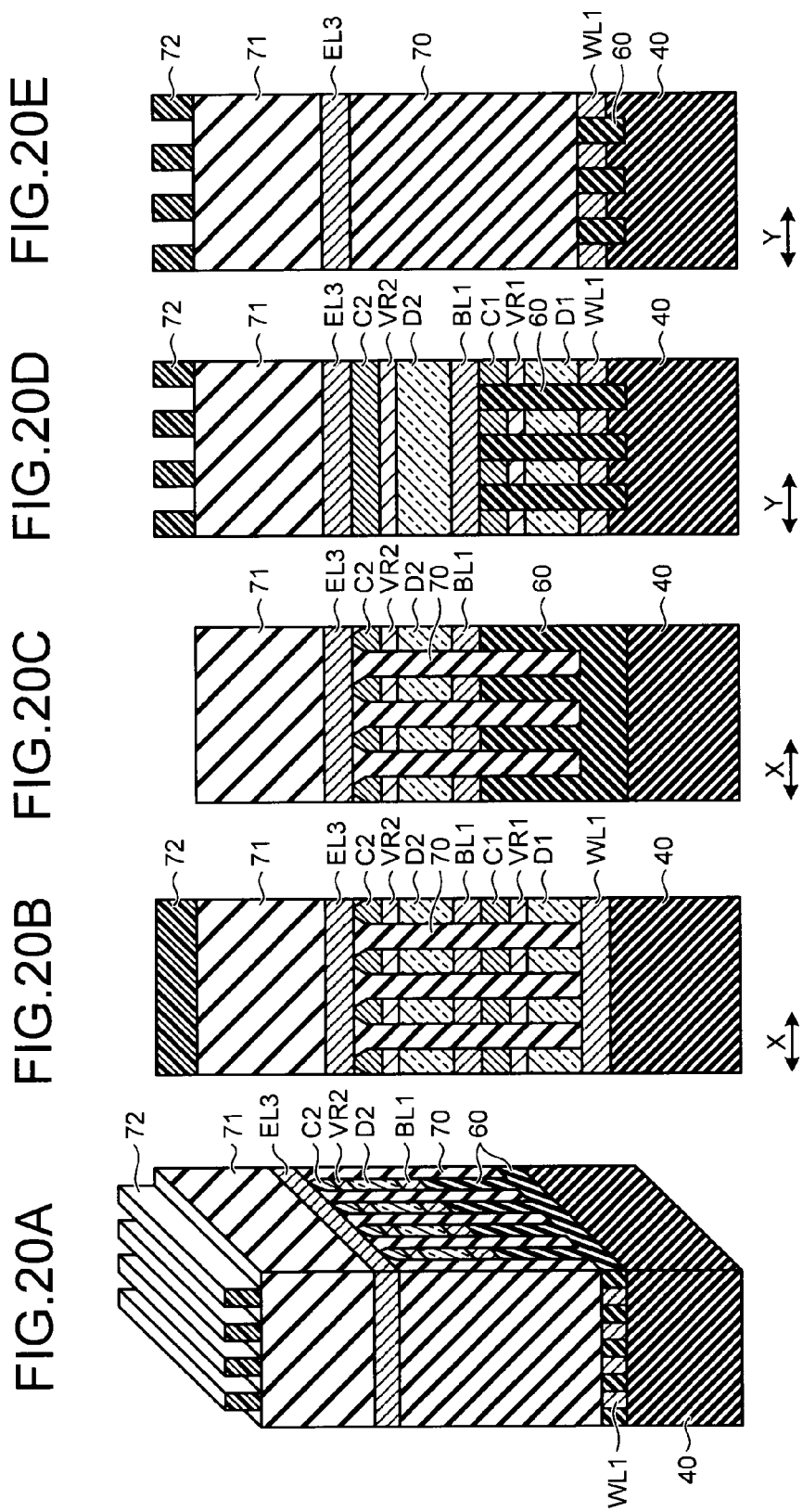

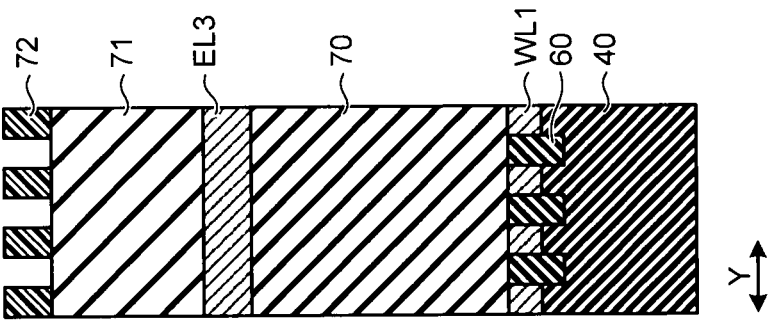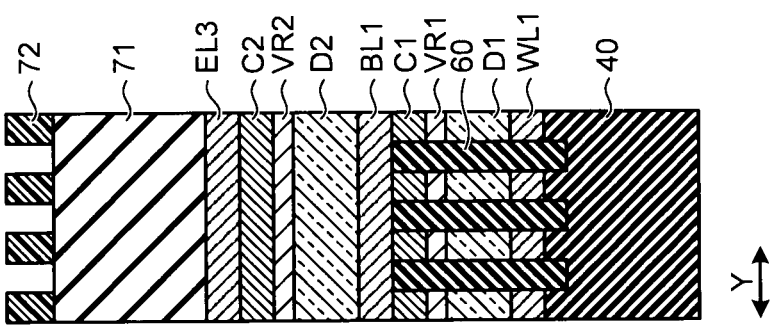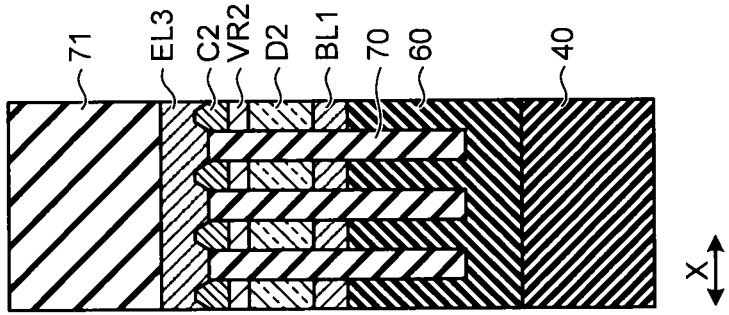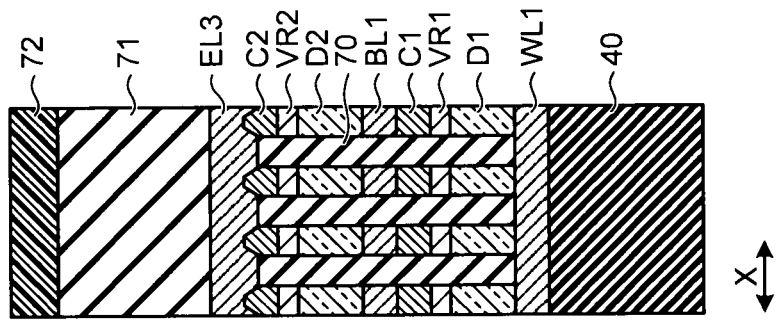

NON-VOLATILE MEMORY DEVICE AND MANUFACTURING METHOD THEREOF

CROSS-REFERENCE TO RELATED APPLICATIONS

This application is based upon and claims the benefit of priority from the prior Japanese Patent Application No. 2010-63186, filed on Mar. 18, 2010; the entire contents of which are incorporated herein by reference.

FIELD

Embodiments described herein relate generally to a non-volatile memory device and a manufacturing method thereof.

BACKGROUND

Recently, attention is paid to a Resistive Random Access Memory (ReRAM) which stores resistance value information, for example, a high resistance state and a low resistance state of an electrically rewritable variable resistive element in a non-volatile state as a non-volatile memory device. The ReRAM is configured such that, for example variable resistive type memory cells to each of which a variable resistive element as a memory element and a rectifying element such as a diode and the like are connected in series are disposed in an array state at intersecting points of plural word lines extending in parallel in a first direction and plural bit lines extending in parallel in a second direction vertical to the first direction (refer to, for example, US2009/0137112). Further, the non-volatile memory device having such a structure that plural memory cell arrays are stacked as well as a first wiring or a second wiring is shared between memory cell arrays which are adjacent in a stacked direction is also proposed (refer to, for example, US2009/0283739).

As described in US2009/0283739, the non-volatile memory device is manufactured as described below. A first wiring material layer acting as a word line and a first memory layer, which includes a variable resistive layer acting as a variable resistive element and a diode layer acting as a rectifying element, are stacked on an interlayer insulation film. Next, the first wiring material layer and the first memory layer are etched to line-and-space patterns extending in a first direction by a lithography technique and the reactive ion etching (hereinafter, called the RIE method), and an interlayer insulation film is embedded between the patterns. With the process, the first wiring material layer is made to a word line. Thereafter, a second wiring material layer acting as a bit line and a second memory layer, which includes a variable resistive layer and a diode layer, are stacked on the interlayer insulation film, the second memory layer, the second wiring material layer, the first memory layer, and the interlayer insulation film are etched to line-and-space patterns extending in a second direction by the lithography technique and the RIE method, and an interlayer insulation film is embedded between the patterns. With the process, a memory cell array of a first layer, in which the second wiring material layer is made to the bit line and memory cells having a columnar structure are disposed in a matrix state at cross points of word lines and bit lines, is formed.

Thereafter, memory cell arrays of plural layers are formed by repeatedly performing the same processes. Note that, when a memory layer of an uppermost layer is formed, it is sufficient that a wiring material layer, which acts as a word line or a bit line, is formed on the memory layer of the uppermost layer which is patterned in a first or second direction and in which an interlayer insulation film is embedded between the patterns, a wiring material layer and a memory layer just under the wiring material layer are processed to line-and-space patterns extending in the first or second direction by the lithography technique and the RIE method, and a portion between the patterns is embedded with an interlayer insulation film. When a stacked film of the wiring material layer and the memory layer is etched to the line-and-space patterns, the etching is ordinarily performed using a hard mask, which is composed of an oxide film such as a Tetra-ethoxysilane (TEOS) film and the like, on the stacked film as shown in US2009/0137112.

Incidentally, when plural memory cell arrays are stacked as in US2009/0283739, memory cells arrays for two layers are processed. At the time, however, an interlayer insulation film, which is composed of an oxide film embedded between the line-and-space patterns, must be also etched in addition that the memory layer and the wiring material layer are etched. That is, a problem arises in that a kind of films to be processed by the hard mask is increased.

BRIEF DESCRIPTION OF THE DRAWINGS

FIGS. 3A to FIG. 13E are views showing an example of procedures of a manufacturing method of the non-volatile memory device;

FIG. 14A to FIG. 20E are cross sectional views schematically showing an example of procedures of a manufacturing method of a non-volatile memory device according to a first embodiment;

FIG. 23A to FIG. 24D are sectional views schematically showing an example of procedures of a manufacturing method of a non-volatile memory device according to a second embodiment.

DETAILED DESCRIPTION

In general, according to one embodiment, a non-volatile memory device is formed as described below. First, a wiring material layer, which configures a part an element wiring, is stacked above an element layer, the wiring material layer is processed in a predetermined shape, and the element layer is etched using the wiring material layer as a mask. An insulation layer is embedded between etched patterns, and the insulation layer is removed using the wiring material layer as a stopper. Then, a wiring layer, which is in contact with the wiring material layer, is formed on the insulation layer from which the wiring material layer is exposed.

A non-volatile memory device and a manufacturing method thereof according to embodiments will be explained below in detail referring to the attached drawings. Note that the invention is by no means limited by the embodiments. Sectional views of the non-volatile memory device used in the following embodiments are schematic views and a relation between a thickness and a width of a layer and a ratio of thicknesses of respective layers are different from actual ones.

Further, hereinafter, a structure and a manufacturing method of an ordinary non-volatile memory device will be described below and then the non-volatile memory devices and the manufacturing methods thereof according to the embodiments will be explained after problems when the ordinary non-volatile memory device is processed.

Figure 1:
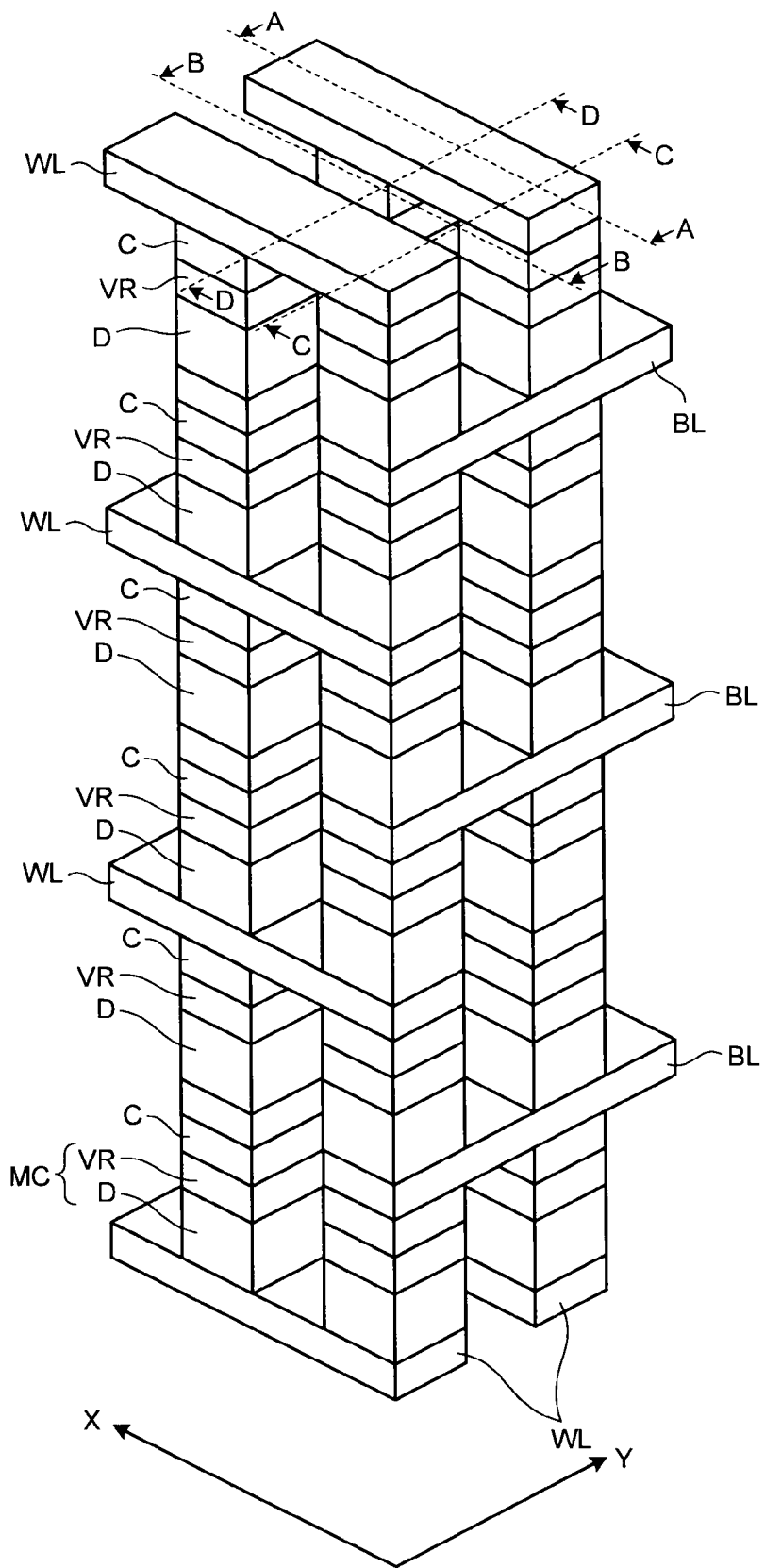
FIG. 1 is a perspective view schematically showing an example of a configuration of a memory cell unit of a non-volatile memory device.
Figure 2:
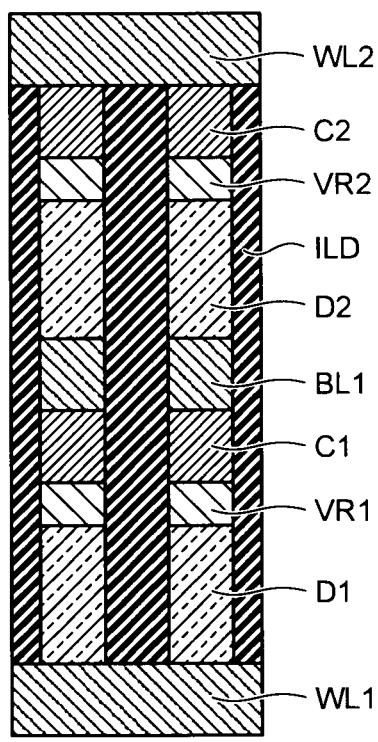
FIG. 2 is a cross sectional view schematically showing a configuration of the non-volatile memory device.
Figure 4E:
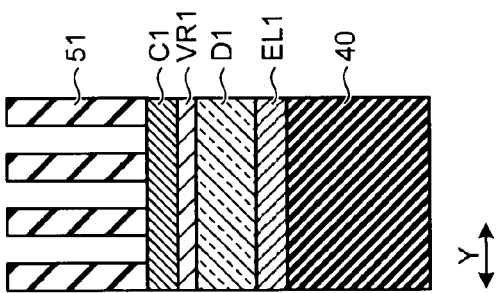
Figure 4D:
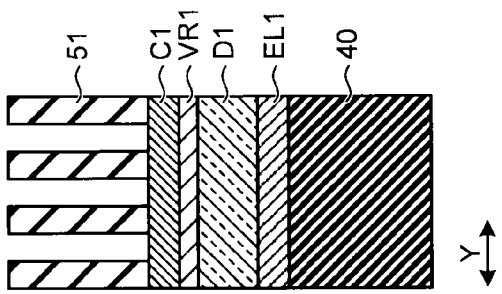
Figure 4C:
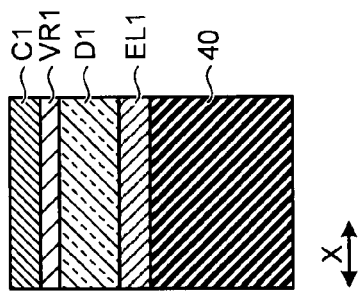
Figure 4B:
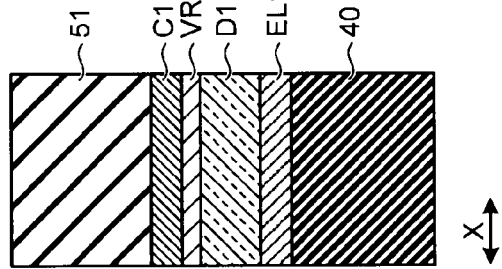
Figure 4A:
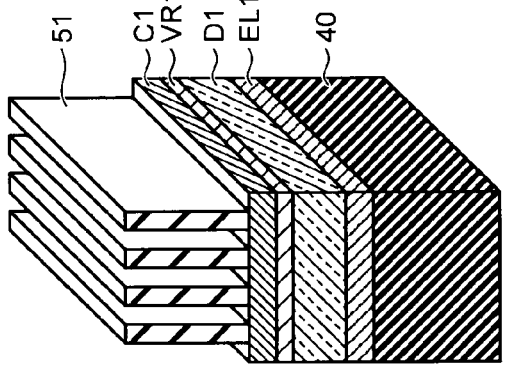

FIG. 1 is a perspective view schematically showing an example of a configuration of a memory cell unit of a non-volatile memory device, and FIG. 2 is a cross sectional view schematically showing a configuration of the non-volatile memory device. FIG. 2 shows a part of an A-A cross section of FIG. 1. The non-volatile memory device includes memory cell arrays disposed with variable resistive type memory cells (hereinafter, simply called also memory cells) MC as non-volatile memory cells in which plural word lines WL extending in an X-direction and plural bit lines BL extending in a Y-direction vertical to the X-direction at a height different from the word lines WL are disposed so as to intersect each other and at the respective intersecting positions of which variable resistive layers VR and rectifying layers D which are non-volatile memory layers are connected in series. FIG. 1 shows a case in which the memory cell arrays are stacked to 6 layers in a height direction and have such a structure that the bit lines BL or the word lines WL are shared between memory cells MC adjacent in a height direction. Note that, in the drawing, cap films C are disposed between the memory cells MC and the upper layer wirings (the word lines WL or the bit lines BL). Further, interlayer insulation films ILD are formed around peripheries of adjacent memory cells MC, between adjacent word lines WL, and between adjacent bit lines BL.

The rectifying layers D are composed of a material having a rectification such as a Schottky diode, a PN junction diode, a PIN diode, and the like. It is assumed here that, for example, the rectifying layers D are set so as to cause a current to flow in a direction from the bit lines BL to the word lines WL.

The variable resistive layers VR are composed of metal oxide which can switch a high resistance state and a low resistance state by controlling a voltage value and an application time. A metal oxide film and the like which contains at least one kind of element, for example, Si, Ti, Ta, Nb, Hf, Zr, W, Al, Ni, Co, Mn, Fe, Cu, Mo, can be exemplified.

The cap films C are films which are composed of a conductive material and introduced in a process to connect the memory cells MC to the upper word lines WL or to the upper bit lines BL. It is assumed here that W films are used as the cap films C.

As described above, the variable resistive type memory cells MC are configured by including a structure in which the rectifying layers D and the variable resistive layers VR are stacked.

In the non-volatile memory device configured as described above, a voltage applied to the word lines WL and the bit lines BL is controlled so that a predetermined voltage is applied to a target memory cell MC, thereby changing a resistance state of the variable resistive layers VR which configure the memory cells MC. Specifically, a current is caused to flow to the variable resistive layers VR in a low resistance state to thereby perform a reset (erase) process for returning the low resistance state to a high resistance state in which a resistance is increased in one-digit or two-digit by Joule heating and a set (write) process for returning the high resistance state to the low resistance state by applying a voltage to the variable resistive layers VR in the high resistance state. As described above, the memory cells MC function as memories by storing resistance value information by creating the high resistance state/low resistance state by a reset process and a set process and detecting a difference of currents flowing to the memory cells MC.

FIG. 3A to FIG. 13E are a view showing an example of procedures of the manufacturing method of the non-volatile memory device. FIG. 3A to FIG. 13A are perspective views, FIG. 3B to FIG. 13B are views corresponding to an A-A cross section of FIG. 1 as sectional views on the word lines WL along the word lines WL, FIG. 3C to FIG. 13C are views corresponding to a B-B cross section of FIG. 1 as sectional views of a portion where no word line WL exists along the word lines WL, FIG. 3D to FIG. 13D are views corresponding to a C-C cross section of FIG. 1 as sectional views on the bit lines BL along the bit lines BL, and FIG. 3E to FIG. 13E are views corresponding to a D-D cross section of FIG. 1 as sectional views of a portion where no bit line BL exist along the bit lines BL.

First, elements such as a cell control transistor and the like, which are connected to a word line WL and a bit line BL of a memory cell MC, and a not shown peripheral circuit, which includes a wiring layer connected to the elements, are formed on a not shown semiconductor substrate, and an interlayer insulation film 40 is formed on the peripheral circuit. Next, as shown in FIG. 3A to FIG. 3E, a film for configuring a memory cell array of a first layer is stacked on an entire surface on the interlayer insulation film 40 and patterned in a lower wiring (word line WL) shape. That is, an electrode layer EL1, a rectifying layer D1, a variable resistive layer VR1, and a cap film C1 are sequentially stacked. Note that, for example, W can be used as the electrode layer EL1 and the cap film C1, for example, NiO can be used as the variable resistive layer VR1, and, for example, a polysilicon film having a PIN structure, in which a P-type polysilicon, an I-type polysilicon, and an N-type polysilicon are stacked, can be used as the rectifying layer D1. Further, this is the same as to formation of memory cell arrays described below.

Thereafter, a hard mask layer 51 composed of a densified TEOS (D-TEOS) and the like is formed on the cap film C1. The hard mask layer 51 is set to a thickness through which a layer from the electrode layer EL1 to the cap film C1 previously formed can be etched by a dry etching method of the RIE method and the like. Further, a resist 52 is coated on the hard mask layer 51 and patterned in a line-and-space pattern shape extending in an X-direction by a lithography technique.

Thereafter, as shown in FIG. 4A to FIG. 4E, the hard mask layer 51 is processed by anisotropic etching such as the RIE method and the like using the resist 52 as a mask. Further, as shown in FIG. 5A to FIG. 5E, after the resist 52 is removed by discharging oxygen, the stacked layer is etched by the anisotropic etching such as the RIE method and the like until a bottom portion of the electrode layer EL1 is cut by an adjacent electrode layer EL1 using the hard mask layer 51 as a mask. With the processing, the electrode layer EL1 is made to a word line WL1, and the rectifying layer D1, the variable resistive layer VR1, and the cap film C1 are formed as patterns extending in the same X-direction as the word line WL1.

Next, as shown in FIG. 6A to FIG. 6E, an interlayer insulation film 60 such as a TEOS film and the like is embedded in an etched region, and an upper surface is flattened by the CMP method using the cap film C1 as a stopper while removing the interlayer insulation film 60 and the hard mask layer 51 which are formed upward of the cap film C1.

Thereafter, as shown in FIG. 7A to FIG. 7E, a film for configuring a memory cell array of a second layer is stacked. That is, an electrode layer EL2, a rectifying layer D2, a variable resistive layer VR2, and a cap film C2 are stacked in order. Note that the rectifying layer D2 is formed here so that a P-type polysilicon layer, an I-type polysilicon layer, and an N-type polysilicon layer of the rectifying layer D2 are stacked in an order opposite to that of the first rectifying layer D1. This is to cause a current to flow from the bit line BL to the word line WL.

Further, a hard mask layer 61 having a thickness to be described later is formed on the cap film C2. Thereafter, a resist 62 is coated on the hard mask layer 61, and a pattern which is orthogonal to the line-and-space pattern of the lower layer in an in-plane direction, that is, a line-and-space pattern extending in a Y-direction is formed by a lithography technique.

Next, as shown in FIG. 8A to FIG. 8E, the hard mask layer 61 is processed by the anisotropic etching such as the RIE method and the like using the resist 62 as a mask. Further, as shown in FIG. 9A to FIG. 9E, after the resist 62 is removed by discharging oxygen, a portion from the cap film C2 to the rectifying layer D1 is etched until a bottom portion of the rectifying layer D1 is separated from a rectifying layer D1 located adjacent in the X-direction by the anisotropic etching such as the RIE method and the like using the hard mask layer 61 as a mask. With the processing, the electrode layer EL2 of the second layer is made to a bit line BL1, and a memory cell array of the first layer, in which a memory cell MC composed of a stacked film of the variable resistive layer VR1 and the rectifying layer D1 whose sizes are regulated by a width of the word line WL1 and a width of the bit line BL1 is disposed at each intersecting position of the word line WL1 and the bit line BL1. Further, the variable resistive layer VR2, the rectifying layer D2, and the cap film C2 of the second layer are formed as patterns extending in the same Y-direction as the bit line BL1 (the electrode layer EL2 of the second layer).

Thereafter, as shown in FIG. 10A to FIG. 10E, an interlayer insulation film 70 such as a TEOS film and the like is embedded in an etched region, and the interlayer insulation film 70 and the hard mask layer 61, which are formed upward of the cap film C2, are removed by the CMP method using the cap film C2 as a stopper as well as an upper surface is flattened.

Thereafter, processes shown in FIG. 7A to FIG. 10E are repeatedly performed until the memory cell array is stacked to a desired number of layers. However, a line-and-space pattern formed to an electrode layer is extended in the X-direction, the Y-direction, the X-direction, . . . .

Next, as shown in FIG. 11A to FIG. 11E, an electrode layer EL3 acting as a wiring of an uppermost layer is formed. The electrode layer EL3 is formed so as to be in contact with the cap film C2 subsequent to FIG. 10A to FIG. 10E. Further, a hard mask layer 71 having a thickness through which a portion from the electrode layer EL3 to the rectifying layer D2 of the second layer can be etched, is formed on the electrode layer EL3. Thereafter, a resist 72 is coated on the hard mask layer 71, and a pattern which is orthogonal to the line-and-space pattern just under the electrode layer in an in-plane direction, that is, a line-and-space pattern extending in the X-direction is formed by the lithography technique.

Thereafter, as shown in FIG. 12A to FIG. 12E, the hard mask layer 71 is processed by the anisotropic etching such as the RIE method and the like using the resist 72 as a mask, and further a portion from the electrode layer EL3 to the rectifying layer D2 is etched by the anisotropic etching such as the RIE method and the like using the hard mask layer 71 as a mask until a bottom portion of the rectifying layer D2 is separated from a rectifying layer D2 located adjacent in the Y-direction. With the processing, the electrode layer EL3 of a third layer is made to a word line WL2 so that a memory cell array of the second layer, in which a memory cell MC composed of a stacked film of the rectifying layer D2 and the variable resistive layer VR2 whose sizes are regulated by the width of the bit line BL1 and a width of the word line WL2 is disposed at each intersecting position of the bit line BL1 and the word line WL2.

As shown in FIG. 13A to FIG. 13E, an interlayer insulation film 80 such as a TEOS film and the like is embedded in an etched region, and the interlayer insulation film 80 and the hard mask layer 71 formed upward of the word line WL2 are removed by the CMP method using the word line WL2 as a stopper as well as an upper surface is flattened. The non-volatile memory device is manufactured as described above.

Conventionally, as shown in FIG. 9A to FIG. 9E, when memory cell arrays for two layers are processed, metal layers such as the electrode layer EL2, the cap films C2, C1, and the like, the variable resistive layers VR2, VR1, the rectifying layer D2, D1 composed of a semiconductor film, and the interlayer insulation film 60 are processed by the oxide film type hard mask layer 61. In an etching using the oxide film type hard mask, although a metal layer, a variable resistive layer, and a semiconductor layer can be easily processed in an appropriate etching condition, the interlayer insulation film 60 composed of an oxide film cannot generally obtain a selection ratio between it and the oxide film type hard mask. Accordingly, the hard mask layer 61, which can process the interlayer insulation film 60 by etching, is formed in a very large film thickness (a film thickness approximately corresponding to a film thickness of the interlayer insulation film 60) through which the interlayer insulation film 60 embedded between patterns formed by the rectifying layer D1, the variable resistive layer VR1 and the cap film C1 of the first layer can be processed in addition to a film thickness through which the rectifying layer D1, the variable resistive layer VR1, the cap film C1, the electrode layer EL2 (the bit line BL1), the rectifying layer D2, the variable resistive layer VR2, and the cap film C2 can be etched.

However, when the hard mask layer 61 has the large film thickness, since an extracting property is deteriorated when the hard mask layer 61 itself is processed, a sufficient space cannot be secured even on a bottom portion and there is a possibility that mask pattern shape is deteriorated. Further, as an aspect ratio of the hard mask layer 61 increases, it is difficult to transfer a line-and-space pattern of the hard mask layer 61 to a lower layer with a high processing accuracy. As a result, the extracting property of etching particularly to the variable resistive layer VR1 and the rectifying layer D1 is deteriorated and thus an unetched region 101, in which, for example, a portion between the rectifying layers D1 is not perfectly separated, remains in a lower portion between adjacent memory cells MC as shown in FIG. 9B and a short circuit may occur between the adjacent memory cells MC. Note that an illustration of the unetched region 101 is omitted in FIG. 10A to FIG. 10E and subsequent drawings. Further, since a pattern processed using the hard mask layer 61 has a large processing aspect ratio, a problem arises also in that the pattern is liable to be broken after it is processed.

To cope with the problems, a manufacturing method of a non-volatile memory device, which can process a memory layer including a variable resistive layer and a semiconductor layer that act as a non-volatile memory element, a wiring layer acting as a wiring to the non-volatile memory element, and an interlayer insulation film by reducing a mask film thickness as compared with a conventional one and the non-volatile memory device manufacture by the manufacturing method will be explained.

(First Embodiment)

FIG. 14A to FIG. 20E are sectional views schematically showing an example of procedures of a manufacturing method of a non-volatile memory device according to a first embodiment. FIG. 14A to FIG. 20A are perspective views, FIG. 14B to FIG. 20B are views corresponding to an A-A cross section of FIG. 1 as sectional views on a word line WL along the word line WL, FIG. 14C to FIG. 20C are views corresponding to a B-B cross section of FIG. 1 as sectional views of portion where no word line WL exists along the word line WL, FIG. 14D to FIG. 20D are views corresponding to a C-C cross section of FIG. 1 as sectional views on a bit line BL along the bit line BL, and FIG. 14E to FIG. 20E are views corresponding to a D-D cross section of FIG. 1 as sectional views of a portion where no bit line BL exits along the bit line BL.

Note that procedures from FIG. 3A to FIG. 8E are the same as those described above. That is, a word line WL1, a rectifying layer D1, a variable resistive layer VR1, and a cap film C1 are formed in line-and-space patterns extending in an X-direction, and after an interlayer insulation film 60 is embedded between the patterns, an electrode layer EL2, a rectifying layer D2, a variable resistive layer VR2, a cap film C2, and a hard mask layer 61 are formed, and the hard mask layer 61 is processed to line-and-space patterns extending in a Y-direction.

Next, as shown in FIG. 14A to FIG. 14E, a portion from the cap film C2 to the electrode layer EL2 is etched by anisotropic etching (dry etching) such as the RIE method and the like using the hard mask layer 61 as a mask. Further, as shown in FIG. 15A to FIG. 15E, the cap film C1 and the variable resistive layer VR1 of a first layer is etched using the hard mask layer 61 as a mask.

Thereafter, as shown in FIG. 16A to FIG. 16E, the interlayer insulation film 60 is etched by a fluorocarbon gas using the hard mask layer 61 and the cap film C2 as masks. $C_4F_6$, $C_4F_8$, $CF_4$, $CHF_3$, $CH_2F_2$, $CH_3F$, and the like can be used as the fluorocarbon gas. Note that, in the etching, although the hard mask layer 61 is also etched at the same time and lost while it is processed, thereafter the interlayer insulation film 60 is etched using the cap film C2 as a mask. That is, the hard mask layer 61 having an excessively large film thickness is not necessary as compared with the case in FIG. 9A to FIG. 9E in which the interlayer insulation film 60 is also etched while remaining the hard mask layer 61. Further, as shown in FIG. 17A to FIG. 17E, the rectifying layer D1 is etched using an etching gas mainly composed of HBr and using the cap film C2 as a mask.

With the above processes, a portion from the cap film C2 to the electrode layer EL2 of a second layer patterned in a line-and-space pattern extending in the Y-direction, and the electrode layer EL2 is made to a bit line BL1. A memory cell array of a first layer, in which a memory cell MC composed of a stacked film of the rectifying layer D1 and the variable resistive layer VR1 whose sizes are regulated by a width of the word line WL1 and a width of the bit line BL1 is disposed at each intersecting position of the word line WL1 and the bit line BL1.

When the interlayer insulation film 60 and the rectifying layer D1 of FIG. 16A to FIG. 17E are etched, since the cap film C2 is used as the mask, a corner portion of an upper surface of the cap film C2, which extends in a bit line direction is beaten by etching as shown in FIG. 17A to FIG. 17E, and thus a cross section of the cap film C2 in a direction vertical to a direction to the bit line BL1 extends has a taper shape. That is, a cross sectional area of the cap film C2 in a direction in parallel with a substrate surface is increased toward a lower portion. As a result, a distance between adjacent cap films C2 is more widened than the case of FIG. 9A to FIG. 9E.

Figure 21A:
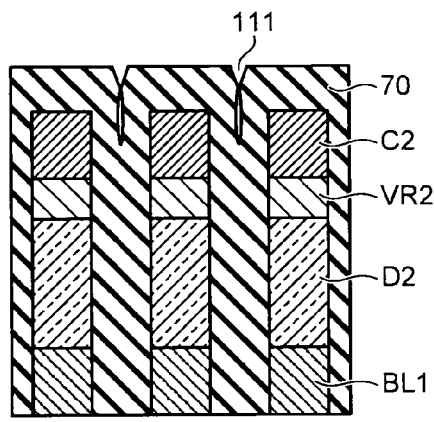
FIG. 21A and FIG. 21B are cross sectional views schematically showing how an interlayer insulation film is embedded.
Figure 21B:
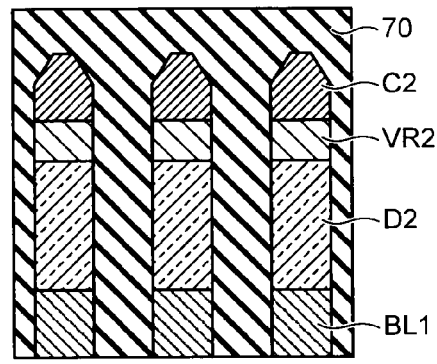

Next, as shown in FIG. 18A to FIG. 18E, an interlayer insulation film 70 such as a TEOS film and the like is embedded in an etched region. FIG. 21A and FIG. 21B are sectional views schematically showing how the interlayer insulation film is embedded. FIG. 21A shows a state in which an interlayer insulation film 70 is embedded after the hard mask layer 61 is processed as a mask, and FIG. 21B shows a state in which an interlayer insulation film 70 is embedded after the hard mask layer 61 and the cap film C2 are processed as masks.

As shown in FIG. 21A, when the hard mask layer 61 is processed as the mask, a cross section of the cap film C2 is made to a rectangular shape. Accordingly, when the interlayer insulation film 70 is embedded between patterns constituting a line-and-space pattern, since upper portions of the patterns are formed in a rectangular shape, a embedding property is deteriorated and a seam 111 is liable to be formed in the vicinity of an upper portion between the patterns. Further, even if it is intended to embed the interlayer insulation film 70 between the patterns while remaining the hard mask layer 61 used as the etching mask on the cap film C2, since a corner portion of an upper surface of the hard mask layer 61, which is composed of an oxide film type insulation material, is unlike to be made to a taper shape when the hard mask layer 61 is beaten by the etching and further an aspect ratio of the patterns is increased by a film thickness of the hard mask layer 61, it is also difficult to increase the embedding property. In contrast, as shown in FIG. 21B, in the first embodiment, since a cross section of the cap film C2 in a direction vertical to the bit line has a taper shape, a space of an upper portion between adjacent patterns is widened, a embedding property of the interlayer insulation film 70 is improved as compared with the case of FIG. 21A, and a portion between the patterns can be embedded without generating a seam.

Thereafter, as shown in FIG. 19A to FIG. 19E, the interlayer insulation film 70 formed upward of the cap film C2 is removed by the CMP method using the cap film C2 as a stopper as well as an upper surface is flattened. The interlayer insulation film 70 is removed so that an upper surface of the interlayer insulation film 70 is approximately as high as an upper surface of the cap film C2.

Thereafter, processes shown in FIG. 14A to FIG. 19E are repeatedly performed until the memory cell array is stacked to a desired number of layers. However, a line-and-space pattern formed to the electrode layer is extended in the X-direction, the Y-direction, the X-direction, . . . .

Next, as shown in FIG. 20A to FIG. 20E, an electrode layer EL3 as a wiring of an uppermost layer is formed. The electrode layer EL3 is formed so as to be in contact with the cap film C2 subsequent to FIG. 19A to FIG. 19E. Further, a hard mask layer 71 having a thickness through which a portion from the electrode layer EL3 to the variable resistive layer VR2 can be processed is formed on the electrode layer EL3. Thereafter, a resist 72 is coated on the hard mask layer 71, and a pattern which is orthogonal to the line-and-space pattern just under the electrode layer in an in-plane direction, that is, a line-and-space pattern extending in the X-direction is formed by the lithography technique.

Thereafter, as explained in FIG. 15A to FIG. 17E, the electrode layer EL3, the cap film C2, and the variable resistive layer VR2 are etched by the anisotropic etching such as the RIE method and the like using the hard mask layer 71 as a mask. With the process, the electrode layer EL3 is made to a word line WL2. Further, the interlayer insulation film 70 is etched by a fluorocarbon gas using the hard mask layer 71 and the word line WL2 as masks, and further the rectifying layer D2 is etched using the word line WL2 as a mask and using a gas mainly composed of HBr. Then, the non-volatile memory device can be obtained by embedding an interlayer insulation film 80 between the patterns.

Note that although the cap film C2 of the non-volatile memory device formed as described above has a taper shape in a cross section vertical to a direction in which a wiring (bit line BL1 in the example) of a the lower layer of the cap film C2 extend, the cap film C2 is formed in a non-taper shape in a cross section in a direction vertical to a direction in which the wiring (word line WL2 in the example) of an upper layer extends. This is because when processing is performed to form a wiring shape of the lower layer, a cap film acts as a mask at the time a rectify layer is etched as described above, and a corner portion, which is in parallel with a direction in which the wiring of the lower layer extend, is etched. However, when processing is performed to form a wiring shape of the upper layer, since a non-volatile memory layer and a wiring layer are formed on the cap film and a corner portion of the cap film, which is in parallel with a wiring of the upper layer, is not exposed, the corner portion cannot be etched.

In the first embodiment, the cap film C2, the variable resistive layer VR2, the rectifying layer D2 and the electrode layer EL2 of the upper layer, and the cap film C1 and the variable resistive layer VR1 of the lower layer are processed using the oxide film type hard mask layer 61 as a mask, the interlayer insulation film 60 is etched by a fluorocarbon gas using the hard mask layer 61 and the cap film C2 of the upper layer as masks, and the rectifying layer D1 of the lower layer is processed using the cap film C2 of the upper layer as a mask. That is, since the cap film C2, which is disposed as a stopper in a process and composed of a metal material, is provided with a function as an etching mask, the interlayer insulation film 60 can be easily processed as compared with a case in which only the hard mask layer 61 is used as the etching mask as well as a new mask forming process is not necessary to process the interlayer insulation film 60. Since the aspect ratio is reduced by reducing a thickness of the hard mask layer 61, a processing accuracy can be improved when the line-and-space patterns are formed as well as a possibility that the pattern are broken can be reduced. Note that the cap films C1, C2 correspond to a wiring material layer, the variable resistive layers VR1, VR2 and the rectifying layers D1, D2 correspond to an element material layer, and the electrode layers EL1 to EL3 correspond to a wiring layer. Further, the variable resistive layers VR1, VR2 and the rectifying layers D1, D2, which are formed in the line-and-space pattern, correspond to an element forming unit.

Further, since the cap film C2 is used as the mask, the corner portion of the upper portion of the cap film C2 is beaten and formed in a taper shape in a cross section in a direction vertical a direction in which the pattern extends and thus a distance between adjacent cap films C2 are widened. Further, when the line-and-space pattern is formed, since the hard mask layer 61 on the cap film C2 already disappears, the aspect ratio of the pattern can be reduced accordingly and thus there is also an effect that the embedding property of the interlayer insulation film 70 between the patterns can be improved.

Figure 22A:
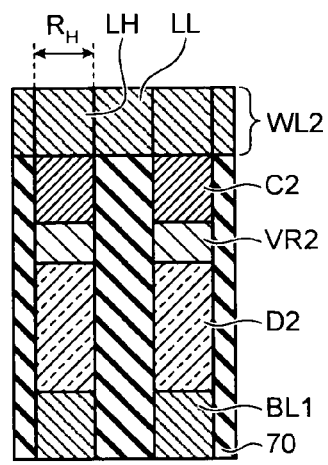
FIG. 22A and FIG. 22B are sectional views schematically showing a state of an upper layer wiring in the non-volatile memory device.
Figure 22B:
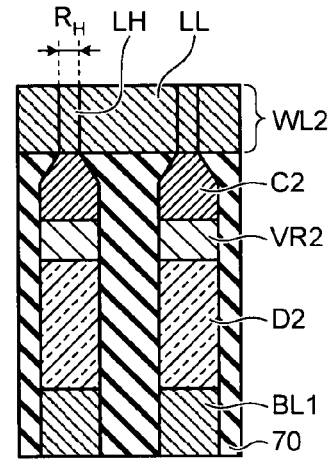

In general, W used in the word line WL and the bit line BL is liable to be influenced by a material existing in a ground layer. For example, a specific resistance of W formed on an insulation film is low, and a specific resistance of W formed on a conductive material such as TiN and the like is high. FIG. 22A and FIG. 22B are sectional view schematically showing a state of an upper layer wiring in the non-volatile memory device, wherein FIG. 22A shows a case of a non-volatile memory device having an ordinary structure, and FIG. 22B shows a case of the non-volatile memory device according to the first embodiment.

As shown in FIG. 22A and FIG. 22B, in the word line WL2 as the upper layer wiring, a high specific resistance layer LH is formed on the cap film C2, and a low specific resistance layer LL is formed on the interlayer insulation film 70 between the cap films C2. However, as shown in FIG. 22B, in the first embodiment, since a cross sectional shape of the cap film C2 is made to a taper shape, a high specific resistance layer forming region $R_H$, in which the high specific resistance layer LH is formed is made smaller than the high specific resistance layer forming region $R_H$ at the time a cross section of the cap film C2 of FIG. 22A does not have a taper shape. That is, since a ratio of the high specific resistance layer LH included in the word line WL2 is reduced, a structure of the first embodiment has an effect that an overall resistance value of the upper wirings (the word line WL and the bit line BL) can be reduced as compared with an ordinary structure. In contrast, although illustration is omitted, in a cross section in a direction vertical to a direction in which the upper layer wiring extends, since the corner portion of the upper surface of the cap film C2, which is regulated by a width of the upper surface layer, has a substantially non-taper shape, a reduction of a contact area between the cap film C2 and the upper layer wiring can be suppressed as compared with a case in which the overall corner portion of the upper surface of the cap film C2 has a taper shape.

(Second Embodiment)

In the first embodiment, in FIG. 19A to FIG. 19E, when the interlayer insulation film 70 is removed, a CMP process is stopped at the time the upper surface of the cap film C2 is exposed, and the electrode layer EL3 is formed on an upper portion of the cap film C2 so as to be in contact with the cap film C2. However, in the method, the cap film C2 is in contact with the electrode layer EL3 only on the upper surface of the cap film C2. In a second embodiment, a manufacturing method of a non-volatile memory device, which can increase a contact area between a cap film and an electrode layer as compared with the first embodiment, will be explained.

Figure 23A:
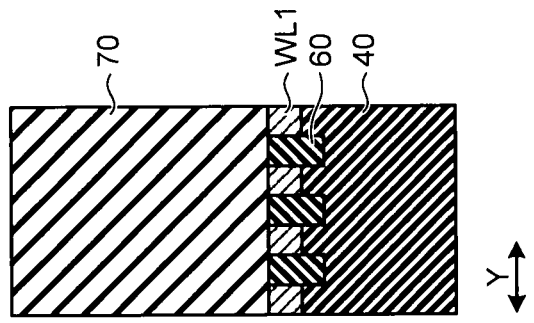
Figure 23B:
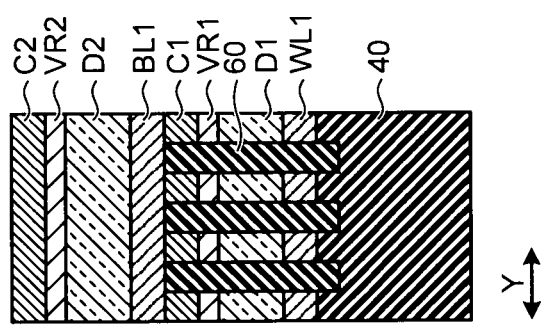
Figure 23C:
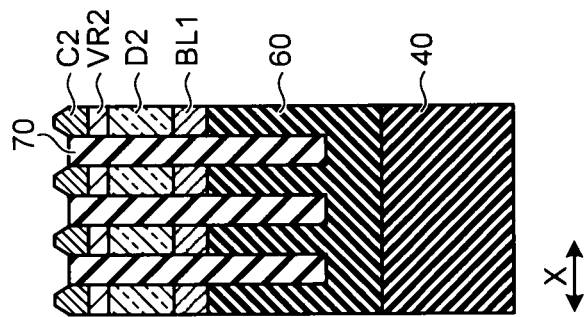
Figure 23D:
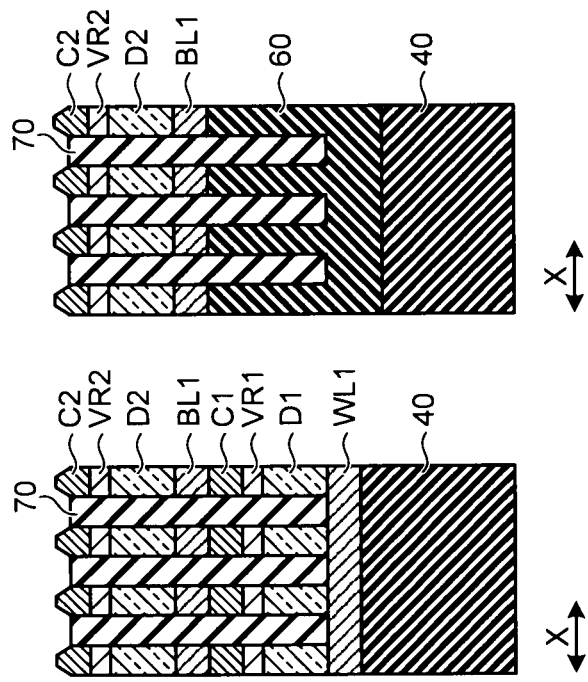

FIG. 23A to FIG. 24D are sectional views schematically showing an example of procedures of the manufacturing method of the non-volatile memory device according to the second embodiment. FIG. 23A and FIG. 24A are views corresponding to an A-A cross section of FIG. 1 as sectional views on a word line WL along the word line WL, FIG. 23B and FIG. 24B are views corresponding to a B-B cross section of FIG. 1 as sectional views of a portion where no word line WL exists along the word line WL, FIG. 23C and FIG. 24C are views corresponding to a C-C cross section of FIG. 1 as sectional views on a bit line BL along the bit line BL, and FIG. 23D and FIG. 24D are views corresponding to a D-D cross section of FIG. 1 as sectional views of a portion where no bit line BL exists along the bit line BL. Note that these drawings correspond to FIG. 19A to FIG. 20E of the first embodiment.

As shown in FIG. 18A to FIG. 18E of the first embodiment, after an interlayer insulation film 70 is embedded between patterns thicker than an upper surface of a cap film C2, the interlayer insulation film 70 is removed by the CMP method using the cap film C2 as a stopper. With the process, as shown in FIG. 19A to FIG. 19E, the upper surface of the cap film C2 is exposed. Thereafter, the interlayer insulation film 70 is further processed by the CMP method in a condition in which the interlayer insulation film 70 ($SiO_2$) has a higher polish rate (removal rate) than the cap film C2 (W). With the process, as shown in FIG. 23A to 23D, an upper surface of the interlayer insulation film 70 can be more retreated than the upper surface of the cap film C2 by a predetermined depth.

Then, as shown in FIG. 24A to 24D, an electrode layer EL3 and a hard mask layer 71 are sequentially formed on an upper surface on which the cap film C2 is exposed in a convex state to the interlayer insulation film 70, a resist 72 is coated on the hard mask layer 71, and a predetermined pattern is formed. Thereafter, the processes explained in FIG. 20A to FIG. 20E of the first embodiment is performed.

In the above-mentioned example, a position of the upper surface of the interlayer insulation film 70 is more retreated than a position of the upper surface of the cap film C2 by the CMP method. However, the position of the upper surface of the interlayer insulation film 70 can be more retreated than the position of the upper surface of the cap film C2 by also etching the interlayer insulation film 70 in a condition in which the interlayer insulation film 70 can be more easily etched than the cap film C2 by a wet etching using a fluorinated acid chemical. In the case, an etching amount of the interlayer insulation film 70 can be controlled with a higher than the case in which the CMP method is used.

The second embodiment has an effect that a contact area between the cap film C2 and an upper layer wiring (the word line WL or the bit line BL) can be increased. Further, the second embodiment is also effective when a dummy pattern composed of a stacked film similar to a memory cell unit is disposed to a periphery of the memory cell unit from a view point of improving flatness when the interlayer insulation film is formed between patterns.

Figure 25A:
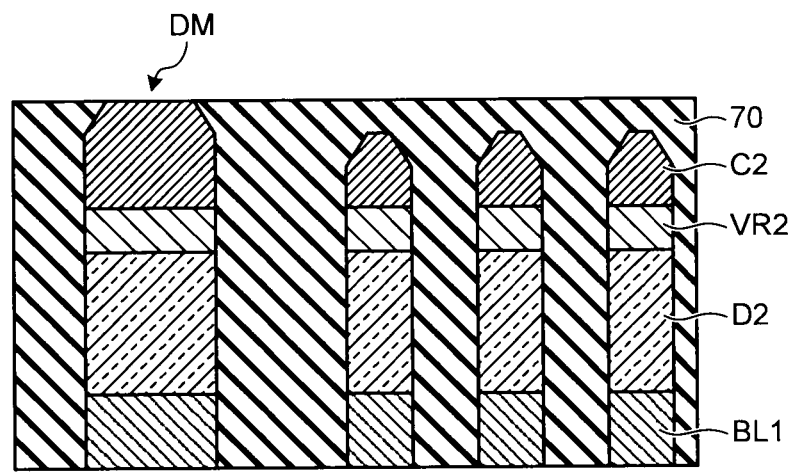
FIG. 25A and FIG. 25B are sectional views schematically showing a state in which a dummy pattern composed of a stacked film similar to a memory cell unit is formed in a periphery of a memory cell unit.
Figure 25B:
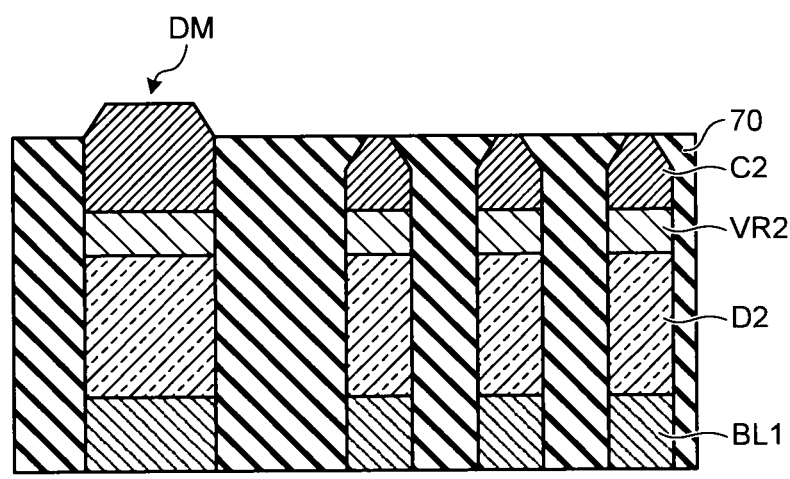

FIG. 25A and FIG. 25B are sectional views schematically showing a state in which the dummy pattern composed of the stacked film similar to the memory cell unit is disposed to the periphery of the memory cell unit. FIG. 25A is a view corresponding to the first embodiment showing the state that the interlayer insulation film 70 is formed between the patterns by the CMP method using the cap film C2 as the stopper, and FIG. 25B is a view corresponding to the second embodiment showing the state that the interlayer insulation film 70 is formed between the patterns likewise.

As shown in FIG. 25A and FIG. 25B, when flattening is performed by the CMP method after the interlayer insulation film 70 is embedded between the patterns in the memory cell unit, a dummy pattern DM, which is composed of a stacked film similar to the memory cell unit and has a pattern size larger than a pattern of the memory cell unit, may be disposed to the periphery of the memory cell unit to prevent excessive deterioration of a flatness because the interlayer insulation film 70 is excessively removed in the periphery of the memory cell unit. In the case, when the stacked film is patterned using the cap film C2 as an etching mask, since an film amount of the cap film C2 is outstandingly reduced in a pattern of the fine memory cell unit, there is a possibility that the pattern is formed in a state that a height of an upper surface is more retreated than the dummy pattern DM.

Accordingly, when the interlayer insulation film 70 embedded between the patterns is removed to approximately the same height as the upper surface of the cap film C2, as shown in FIG. 25A, there is a possibility that the upper surface of the cap film C2 is not perfectly exposed in the memory cell unit and a defective open to the upper layer wiring may occur. In contrast, in the second embodiment, since the upper surface of the interlayer insulation film 70 is retreated by the CMP method or the wet etching until the upper surface of the cap film C2 in the memory cell unit is exposed as shown in FIG. 25B, the cap film C2 can be caused to be securely in contact with the upper layer wiring.

Note that although the cap film C2 of the dummy pattern DM has a taper shape in a cross section vertical to a direction in which the wiring (in the example, the bit line BL1) of the lower layer of the cap film C2 extends likewise the memory cell MC of the cap film C2, the cap film C2 is formed in a non-taper shape in a cross section in a direction vertical to a direction in which a not shown upper layer wiring extends.

Further, in the explanation described above, the case, in which the variable resistive element is used as the non-volatile memory element, is exemplified. In addition to the above-mentioned, however, a phase change memory element, which stores information by changing a resistance value by a state change of crystallization/amorphousization of a chalcogenide compound, a Magnetic Random Access Memory (MRAM) element, which stores information by changing a resistance value by a tunnel magnetic resistance effect, an anti-fuse element, and the like may be used as the non-volatile memory element.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A manufacturing method of a non-volatile memory device comprising:
    stacking a wiring material layer that configures a part of an element wiring above an element layer;
    processing the wiring material layer in a predetermined shape;
    etching the element layer using the wiring material layer as a mask;
    embedding an insulation layer between etched patterns;
    removing the insulation layer using the wiring material layer as a stopper; and
    forming a wiring layer in contact with the wiring material layer on the insulation layer from which the wiring material layer is exposed.

2. The manufacturing method of the non-volatile memory device according to claim 1, wherein the removing the insulation layer includes removing the insulation layer so that an upper surface of the wiring material layer approximately agrees with an upper surface of the insulation layer.

3. The manufacturing method of the non-volatile memory device according to claim 1, wherein the removing the insulation layer includes, after an upper surface of the wiring material layer is caused to approximately agree with an upper surface of the insulation layer, removing the insulation layer so that the upper surface of the insulation layer is retreated to the upper surface of the wiring material layer by a predetermined depth.

4. The manufacturing method of the non-volatile memory device according to claim 3, wherein the removing the insulation layer is processed by the CMP method or by a wet etching using a fluorinated acid chemical in a condition that a removal rate of the insulation layer is made higher than the wiring material layer.

5. A manufacturing method of a non-volatile memory device comprising:
    stacking, above an element layer in which a first insulation layer is formed between element forming units each of which acts as a first element and has a predetermined shape, an element material layer acting as a second element, a wiring material layer that configures a part of a wiring of the second element, and a mask layer composed of an insulation material;

processing the mask layer in a predetermined shape;

etching the wiring material layer and the element material layer using the mask layer as a mask;

etching, after the wiring material layer and the element material layer are etched, the first insulation layer of the element layer using the mask layer and the wiring material layer as masks;

forming, after the first insulation layer is etched, the first element by etching the element forming units of the element layer using the wiring material layer as a mask;

embedding, after the first element is formed, a second insulation layer between an etched patterns;

removing the second insulation layer using the wiring material layer as a stopper; and forming a wiring layer acting as the wiring of the second element on the second insulation layer from which the wiring material layer is exposed.

6. The manufacturing method of the non-volatile memory device according to claim 5, wherein the etching the first insulation layer includes removing the mask layer while etching the first insulation layer of the element layer using a fluorocarbon gas.

7. The manufacturing method of the non-volatile memory device according to claim 6, wherein the forming the first element includes etching the element forming units using a gas mainly composed of HBr.

8. The manufacturing method of the non-volatile memory device according to claim 5, wherein the removing the second insulation layer includes removing the second insulation layer so that an upper surface of the wiring material layer approximately agrees with an upper surface of the second insulation layer.

9. The manufacturing method of the non-volatile memory device according to claim 5, wherein the removing the second insulation layer includes, after an upper surface of the wiring material layer is caused to approximately agree with an upper surface of the second insulation layer, removing the second insulation layer so that the upper surface of the second insulation layer is retreated to the upper surface of the wiring material layer by a predetermined depth.

10. The manufacturing method of the non-volatile memory device according to claim 9, wherein the removing the second insulation layer is processed by the CMP method or by a wet etching using a fluorinated acid chemical in a condition that a removal rate of the second insulation layer is made higher than the wiring material layer.

11. The manufacturing method of the non-volatile memory device according to claim 5, wherein the processing the mask layer includes making the mask layer to line-and-space patterns extending in a predetermined direction.

12. The manufacturing method of the non-volatile memory device according to claim 5, wherein the processing the mask layer includes processing the mask layer so as to include a first pattern to etch the element forming units to a predetermined shape in a region in which the first and second elements are formed, and a second pattern having a pattern size larger than the first pattern in a periphery of the region in which the first and second elements are formed; and the removing the second insulation layer includes removing the second insulation layer until the wiring material layer of the first pattern is exposed.

13. The manufacturing method of the non-volatile memory device according to claim 5, wherein the first insulation layer, the second insulation layer, and the mask layer are composed of oxide.

* * * * *